(12) United States Patent
Park et al.

(10) Patent No.: US 11,410,967 B2
(45) Date of Patent: Aug. 9, 2022

(54) DISPLAY DEVICE AND METHOD OF MANUFACTURING THE SAME

(71) Applicant: Samsung Display Co., Ltd., Yongin-Si (KR)

(72) Inventors: Chan-Jae Park, Suwon-si (KR); Kikyung Youk, Bucheon-si (KR); Sangduk Lee, Yongin-si (KR); Hyun a Lee, Seoul (KR); Daehwan Jang, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 110 days.

(21) Appl. No.: 16/943,241

(22) Filed: Jul. 30, 2020

(65) Prior Publication Data

US 2021/0043600 A1 Feb. 11, 2021

(30) Foreign Application Priority Data

Aug. 7, 2019 (KR) .................... 10-2019-0095930

(51) Int. Cl.
*H01L 23/00* (2006.01)
*H01L 25/18* (2006.01)
(Continued)

(52) U.S. Cl.
CPC ............. *H01L 24/92* (2013.01); *H01L 24/16* (2013.01); *H01L 24/73* (2013.01); *H01L 24/81* (2013.01);
(Continued)

(58) Field of Classification Search
None
See application file for complete search history.

(56) References Cited

U.S. PATENT DOCUMENTS

| 5,248,075 A | 9/1993 | Young et al. |
| 10,217,806 B2 | 2/2019 | Kim et al. |

(Continued)

FOREIGN PATENT DOCUMENTS

| JP | 2005268826 A | 9/2005 |
| JP | 4436748 B2 | 3/2010 |

(Continued)

OTHER PUBLICATIONS

Extended European Search Report for Application No. 20188799.9-1210 dated Dec. 17, 2020 enumerating the above listed references.

*Primary Examiner* — Telly D Green
(74) *Attorney, Agent, or Firm* — Cantor Colburn LLP

(57) ABSTRACT

A display device includes a display panel including a display area and a non-display area defined therein and including a plurality of signal pads overlapping the non-display area, an electronic component including a base layer with an upper surface and a lower surface, a plurality of driving pads disposed on the lower surface of the base layer, and a plurality of driving bumps respectively disposed on the plurality of driving pads, the plurality of driving bumps being respectively connected to the signal pads, and a filler disposed between the display panel and the electronic component. A first hole is defined in the upper surface of the base layer, and the first hole does not overlap the plurality of driving bumps in a plan view.

13 Claims, 20 Drawing Sheets

(51) Int. Cl.
*H01L 25/00* (2006.01)
*H01L 27/32* (2006.01)

(52) U.S. Cl.
CPC .............. *H01L 24/83* (2013.01); *H01L 25/18* (2013.01); *H01L 25/50* (2013.01); *H01L 27/3276* (2013.01); *H01L 2224/16145* (2013.01); *H01L 2224/73204* (2013.01); *H01L 2224/81205* (2013.01); *H01L 2224/83874* (2013.01); *H01L 2224/92125* (2013.01); *H01L 2924/10157* (2013.01); *H01L 2924/10158* (2013.01); *H01L 2924/1426* (2013.01)

(56) References Cited

U.S. PATENT DOCUMENTS

| 11,239,306 B2* | 2/2022 | Jo | G09G 3/3275 |
| 2019/0096979 A1 | 3/2019 | Jo et al. | |
| 2020/0167054 A1* | 5/2020 | You | G06F 3/04164 |
| 2020/0312943 A1* | 10/2020 | Jo | H01L 27/124 |

FOREIGN PATENT DOCUMENTS

| KR | 1020060017213 A | 2/2006 |
| KR | 1020150079214 A | 7/2015 |
| KR | 1020180000046 A | 1/2018 |

* cited by examiner

DISPLAY DEVICE AND METHOD OF MANUFACTURING THE SAME

This application claims priority to Korean Patent Application No. 10-2019-0095930, filed on Aug. 7, 2019, and all the benefits accruing therefrom under 35 U.S.C. § 119, the content of which in its entirety is herein incorporated by reference.

BACKGROUND

1. Field

Embodiments of the invention relate to a display device. More particularly, embodiments of the invention relate to a display device and a method of manufacturing the display device.

2. Description of the Related Art

Various display devices that are applied to multimedia devices, such as televisions, mobile phones, tablet computers, navigation units, and game units, are being developed.

The display devices include a display panel displaying an image. The display panel includes gate lines, data lines, and pixels connected to the gate lines and the data lines. The display panel is connected to electronic components that provide electrical signals desired to display the image to the gate lines or the data lines.

The electronic components are mounted on the display panel using an anisotropic conductive film or an ultrasonography method. A connection between the display panel and the electronic components using the ultrasonography method further increases conductivity compared with the anisotropic conductive film and reduces a number of processes.

SUMMARY

Embodiments of the invention provide a display device that electrically connects an electronic component to a display panel using an ultrasonic bonding method.

Embodiments of the invention provide a method of manufacturing the display device.

Embodiments of the invention provide a display device which improves a curing efficiency of a filler filled between the electronic component and the display panel.

An embodiment of the invention provides a display device including a display panel including a display area and a non-display area defined therein and including a plurality of signal pads overlapping the non-display area, an electronic component including a base layer with an upper surface and a lower surface, a plurality of driving pads disposed on the lower surface of the base layer, and a plurality of driving bumps respectively disposed on the plurality of driving pads, the plurality of driving bumps being respectively connected to the plurality of signal pads, and a filler disposed between the display panel and the electronic component. A first hole is defined in the upper surface of the base layer, and the first hole does not overlap the plurality of driving bumps in a plan view.

In an embodiment, the first hole penetrates the upper surface and the lower surface, and the filler is exposed to an outside by the first hole.

In an embodiment, the filler includes a first filling portion disposed between the display panel and the electronic component and a second filling portion disposed in the first hole.

In an embodiment, an upper surface of the second filling portion provides a flat surface together with an upper surface of the electronic component.

In an embodiment, the first filling portion has a height smaller than a height of the second filling portion in a thickness direction of the base layer.

In an embodiment, the first hole has a shape recessed from the upper surface of the base layer.

In an embodiment, the first hole has a height equal to or greater than about 50 percent (%) and smaller than about 100% of a thickness of the base layer in a thickness direction of the base layer.

In an embodiment, the electronic component further includes a pad insulating layer disposed on the base layer to expose a portion of each of the plurality of driving pads and driving lines respectively connected to the plurality of driving pads, and the filler is disposed between the pad insulating layer and the display panel.

In an embodiment, a second hole is further defined in the upper surface of the base layer, the second hole is spaced apart from the first hole in the plan view and recessed from the upper surface of the base layer, and the second hole overlaps at least one driving line among the driving lines.

In an embodiment, the first hole is provided in plural, and the first holes are defined in the base layer to be spaced apart from each other in the plan view.

In an embodiment, the display panel further includes a substrate, a circuit element layer disposed on the substrate, a plurality of first pads overlapping the non-display area, disposed on the substrate, and electrically connected to the circuit element layer, an insulating layer disposed on the substrate to expose a portion of each of the plurality of first pads, and a plurality of second pads respectively disposed on the plurality of first pads exposed by the insulating layer, and the plurality of second pads is the plurality of signal pads.

In an embodiment, the electronic component further includes a plurality of driving lines respectively and electrically connected to the plurality of driving pads, and the first hole does not overlap the plurality of driving lines in the plan view.

In an embodiment, the filler surrounds the plurality of driving bumps in the plan view.

An embodiment of the invention provides a method of manufacturing a display device including providing a display panel including a signal pad overlapping a non-display area, providing an electronic component including a lower surface on which a driving bump is disposed and an upper surface in which a hole is defined not to overlap the driving bump in a plan view, aligning the signal pad of the display panel with the driving bump of the electronic component, allowing the driving bump to contact the signal pad, applying an ultrasonic vibration to the driving bump and the signal pad, disposing a filler between the display panel and the electronic component, and irradiating an ultraviolet light to the filler through the hole.

In an embodiment, the hole has an opening shape that penetrates the upper surface and the lower surface of the electronic component.

In an embodiment, the filler includes a first filling portion and a second filling portion, the first filling portion is disposed between the display panel and the electronic component, and the second filling portion is disposed in the hole.

In an embodiment, the hole has a shape recessed from the upper surface of the electronic component, and the hole has a height equal to or greater than about 50% and smaller than about 100% of a thickness of the electronic component.

In an embodiment, the method further includes irradiating a laser beam to a cutting area defined in the upper surface of the electronic component, and the cutting area corresponds to a shape of the hole.

In an embodiment, the signal pad provides an electrical signal to display elements arranged in a display area of the display panel.

In an embodiment, the hole is provided in plural, and the holes are defined in the upper surface of the electronic component to be spaced apart from each other in the plan view.

According to the above, the external ultraviolet light is transmitted to the filler through the hole defined in the upper surface of the electronic component. As a result, the curing efficiency of the filler may increase. Particularly, when the hole defined in the upper surface of the electronic component is provided in plural, the curing efficiency of the filler may be improved.

BRIEF DESCRIPTION OF THE DRAWINGS

The above and other advantages of the invention will become readily apparent by reference to the following detailed description when considered in conjunction with the accompanying drawings, in which.

DETAILED DESCRIPTION

Figure 1A:
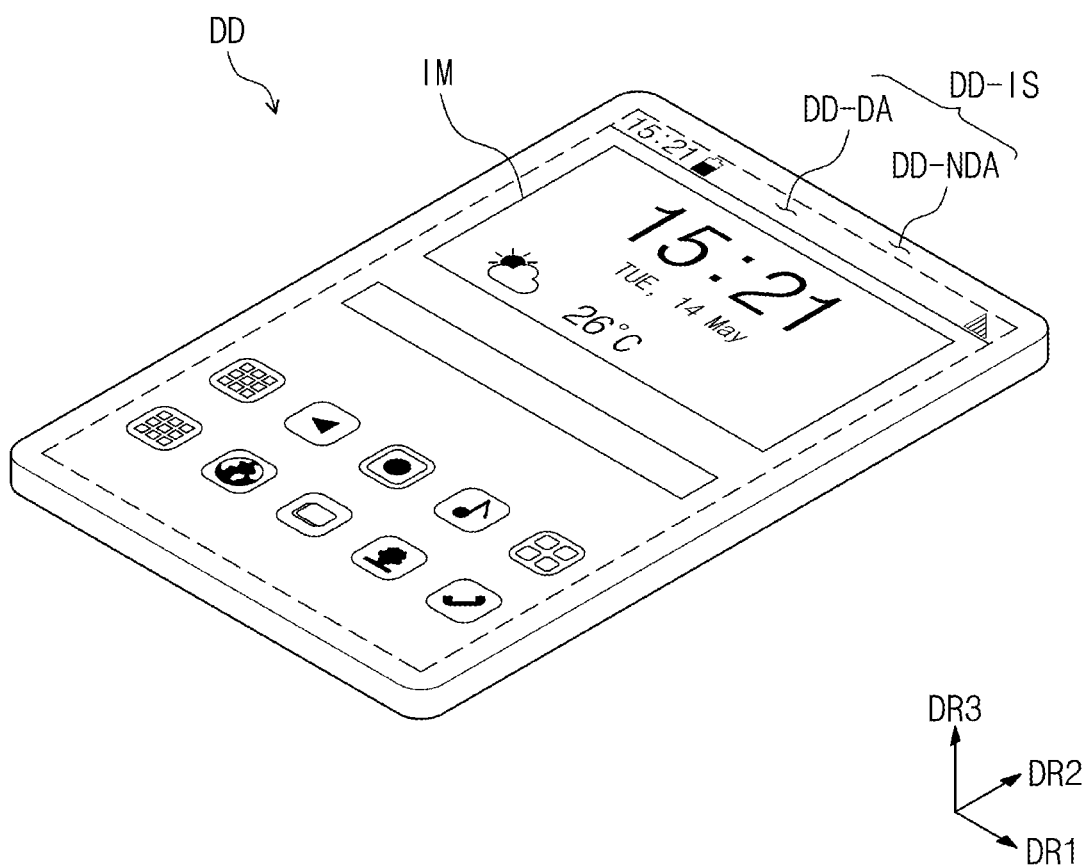
FIG. 1A is a perspective view showing an embodiment of a display device according to the invention.

It will be understood that when an element (or an area, a layer, and a portion) or layer is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content.

As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the drawing figures.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, the invention will be explained in detail with reference to the accompanying drawings.

Figure 1B:
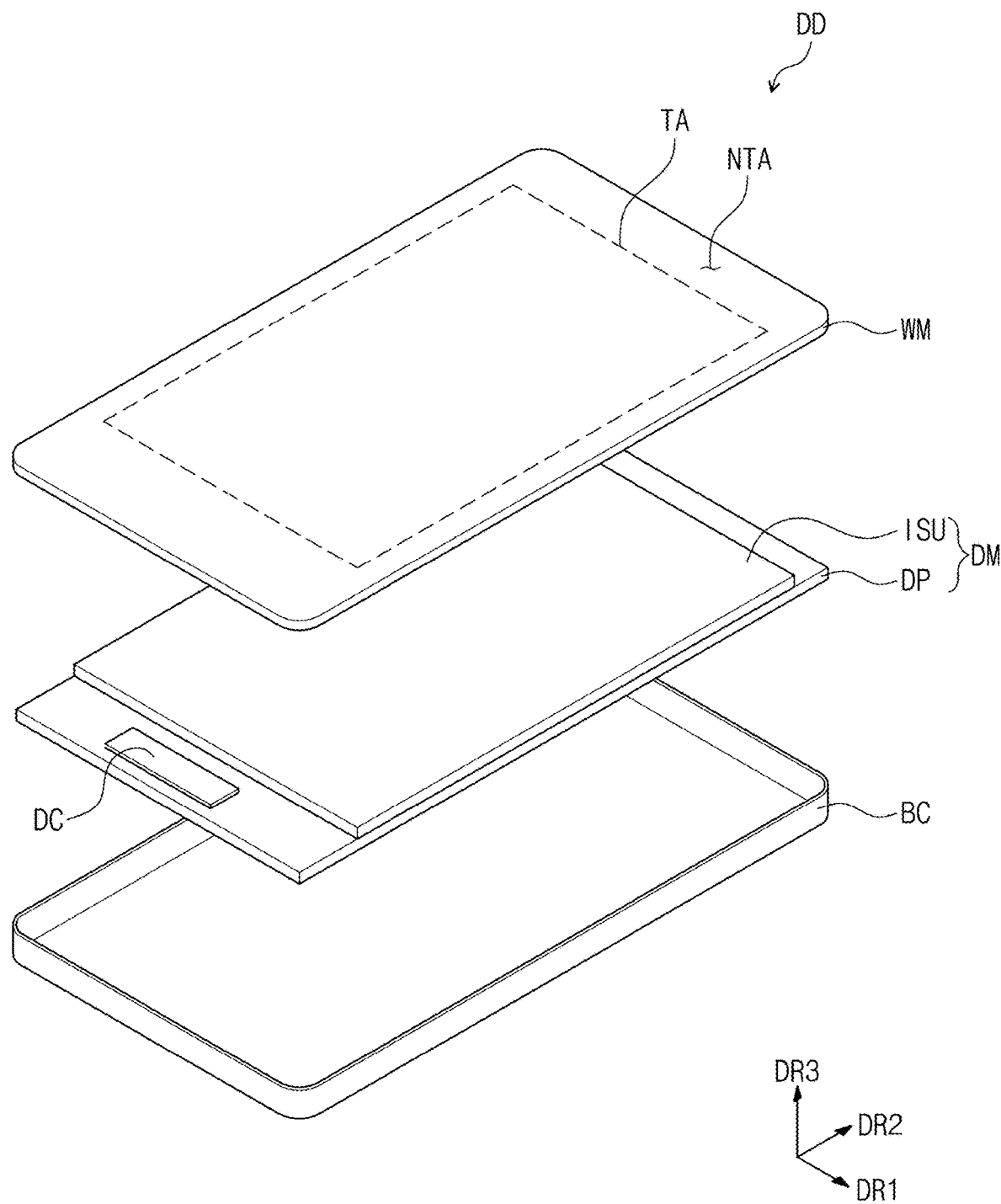
FIG. 1B is an exploded perspective view showing an embodiment of a display device according to the invention.
Figure 2:
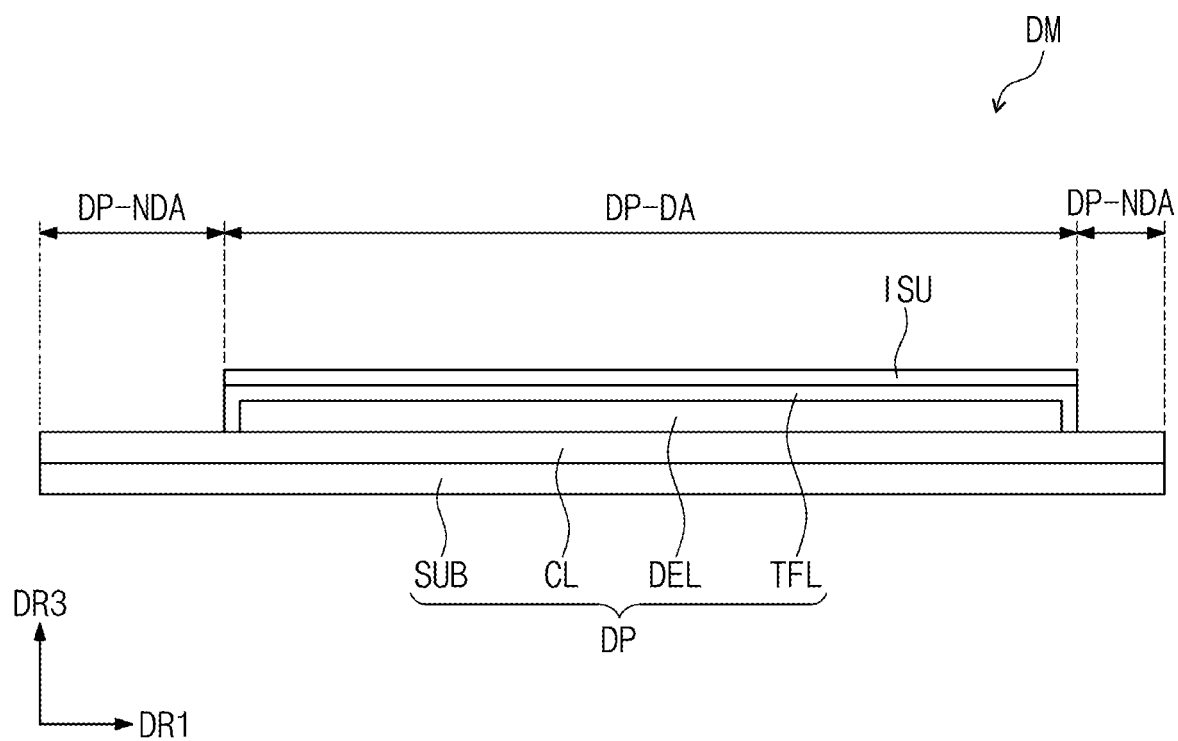
FIG. 2 is a cross-sectional view showing an embodiment of a display module according to the invention.

FIG. 1A is a perspective view showing an embodiment of a display device DD according to the invention. FIG. 1B is an exploded perspective view showing an embodiment of the display device DD according to the invention. FIG. 2 is a cross-sectional view showing an embodiment of a display module DM according to the invention.

In an embodiment, the display device DD may be applied to a mobile phone terminal. Although not shown in drawing figures, electronic modules disposed (e.g., mounted) on a main board, a camera module, and a power supply module may be accommodated in a bracket and a case together with the display device DD, and thus the mobile phone terminal may be provided. The display device DD in an embodiment according to the invention may be applied to a large-sized electronic item, such as a television set and a monitor, and a small and medium-sized electronic item, such as a tablet computer, a car navigation unit, a game unit, and a smart watch.

Referring to FIG. 1A, the display device DD displays an image IM through a display surface DD-IS. FIG. 1A shows icon images as an embodiment of the image IM. The display surface DD-IS is substantially parallel to a plane defined by a first direction DR1 and a second direction DR2. A third direction DR3 indicates a normal line direction of the display surface DD-IS, i.e., a thickness direction of the display device DD. In the following descriptions, an expression "when viewed in a plan view" or "in a plan view" may mean a case of being viewed in the third direction DR3. Hereinafter, front (or upper) and rear (or lower) surfaces of each layer or each unit of the display device DD are distinct from each other by the third direction DR3. However, directions indicated by the first, second, and third directions DR1, DR2, and DR3 are relative to each other, and thus the directions indicated by the first, second, and third directions DR1, DR2, and DR3 may be changed to other directions, e.g., opposite directions.

In addition, the display surface DD-IS includes a display area DD-DA through which the image IM is displayed and a non-display area DD-NDA disposed adjacent to the display area DD-DA. The image IM is not displayed through the non-display area DD-NDA, however, it should not be limited thereto or thereby. The non-display area DD-NDA may be adjacent to one side of the display area DD-DA or may be omitted.

Referring to FIG. 1B, the display device DD may include a window WM, a display module DM, an electronic component DC, and an accommodating member BC. The accommodating member BC may accommodate the display module DM and may be coupled to the window WM.

The window WM may be disposed on the display module DM and may transmit an image provided from the display module DM. The window WM may include a transmission area TA and a non-transmission area NTA. The transmission area TA may overlap the display area DD-DA and may have a shape corresponding to the display area DD-DA. The image IM displayed through the display area DD-DA of the display device DD may be perceived from the outside through the transmission area TA of the window WM.

The non-transmission area NTA may overlap the non-display area DD-NDA and may have a shape corresponding to the non-display area DD-NDA. The non-transmission area NTA may have a relatively low light transmittance compared with that of the transmission area TA. However, the invention should not be limited thereto or thereby, and the non-transmission area NTA may be omitted.

In an embodiment, the window WM may include a glass, sapphire, or plastic material, for example. The window WM is shown to have a single-layer structure, however, the window WM may include a plurality of layers. The window WM may include a base layer and at least one printed layer overlapping the non-transmission area NTA and disposed on a rear surface of the base layer. The printed layer may have a predetermined color. As an example, the printed layer may have a black color or may have other colors rather than the black color.

The display module DM is disposed between the window WM and the accommodating member BC. The display module DM includes a display panel DP and an input sensing unit ISU. The display panel DP generates the image and provides the generated image to the window WM.

The display panel DP in the embodiment of the invention may be a light emission type display panel, however, it should not be particularly limited. In an embodiment, the display panel DP may be an organic light emitting display panel or a quantum dot light emitting display panel, for example. A light emitting layer of the organic light emitting display panel may include an organic light emitting material. A light emitting layer of the quantum dot light emitting display panel may include a quantum dot and a quantum rod.

Hereinafter, the organic light emitting display panel will be described as an embodiment of the display panel DP. However, the invention should not be limited to the organic light emitting display panel, and various display panels may be applied to the invention.

Referring to FIG. 2, the display module DM includes the display panel DP and the input sensing unit ISU. The display panel DP includes a substrate SUB, a circuit element layer CL disposed on the substrate SUB, a display element layer DEL, and an insulating layer TFL.

The display panel DP includes a display area DP-DA and a non-display area DP-NDA. The display area DP-DA of the display panel DP corresponds to the display area DD-DA shown in FIG. 1A, and the non-display area DP-NDA of the display panel DP corresponds to the non-display area DD-NDA shown in FIG. 1A.

The substrate SUB may include at least one plastic film. As an example, the substrate SUB may include a plastic substrate, a glass substrate, a metal substrate, or an organic/inorganic composite substrate as a flexible substrate.

The circuit element layer CL includes at least one insulating interlayer and a circuit element. The insulating interlayer includes at least one intermediate inorganic layer and at least one intermediate organic layer. The circuit element includes signal lines and a pixel driving circuit.

The display element layer DEL includes a plurality of organic light emitting diodes. The display element layer DEL further includes an organic layer such as a pixel definition layer. In another embodiment, when the liquid crystal display panel is provided as the display panel, the display element layer may be a liquid crystal layer.

The insulating layer TFL encapsulates the display element layer DEL. As an example, the insulating layer TFL may be a thin film encapsulation layer. The insulating layer TFL protects the display element layer DEL from moisture, oxygen, and a foreign substance such as dust particles, however, it should not be limited thereto or thereby. An encapsulation substrate may be used instead of the insulating layer TFL. In this case, the encapsulation substrate may face the substrate SUB, and the circuit element layer CL and the display element layer DEL may be disposed between the encapsulation substrate and a base substrate.

The input sensing unit ISU may be disposed between the window WM and the display panel DP. The input sensing unit ISU may sense an input applied from the outside. The input applied from the outside may be provided in various forms. In an embodiment, the external input may include various forms, such as a part of the user's body, a stylus pen, light, heat, or pressure, for example. Also, in addition to an input by contacting a part of user's body, such as a user's hand, a proximity or approaching space touch (e.g., hovering) may be a form of the external input.

The input sensing unit ISU may be directly disposed on the display panel DP. In the invention, the expression "component", "A" is directly disposed on component "B"" means that no intervening elements, such as an adhesive layer, are between the component "A" and the component "B". The input sensing unit ISU may be provided together with the display panel DP through successive processes. However, the invention should not be limited thereto or thereby. The input sensing unit ISU may be coupled to the display panel DP by an adhesive layer after being provided as a separate panel. As another example, the input sensing unit ISU may be omitted.

Referring back to FIG. 1B, the electronic component DC may overlap the non-display area DP-NDA and may be disposed on the display panel DP. According to the invention, the electronic component DC may be, but not limited to, a driving chip that transmits a driving signal to the display panel DP. In an embodiment, the electronic component DC may generate a driving signal desired for an operation of the display panel DP based on a control signal provided from the outside, for example. The electronic component DC may transmit the generated driving signal to the circuit element layer CL of the display panel DP.

In the embodiment of the invention, the electronic component DC may be electrically connected to the display panel DP by the ultrasonic bonding method. In an embodiment, a driving bump disposed on the electronic component DC and a signal pad disposed on the display panel DP may contact each other by the ultrasonic bonding method, for example. After the driving bump contacts the signal pad, a filler may be filled between the electronic component DC and the display panel DP. The filler may be cured by being irradiated with an external ultraviolet light.

In the embodiment of the invention, at least one hole may be defined in the upper surface of the electronic component DC. The external ultraviolet light may be irradiated to the filler through the hole defined in the electronic component. The hole defined in the electronic component DC will be described in detail later.

Figure 3:
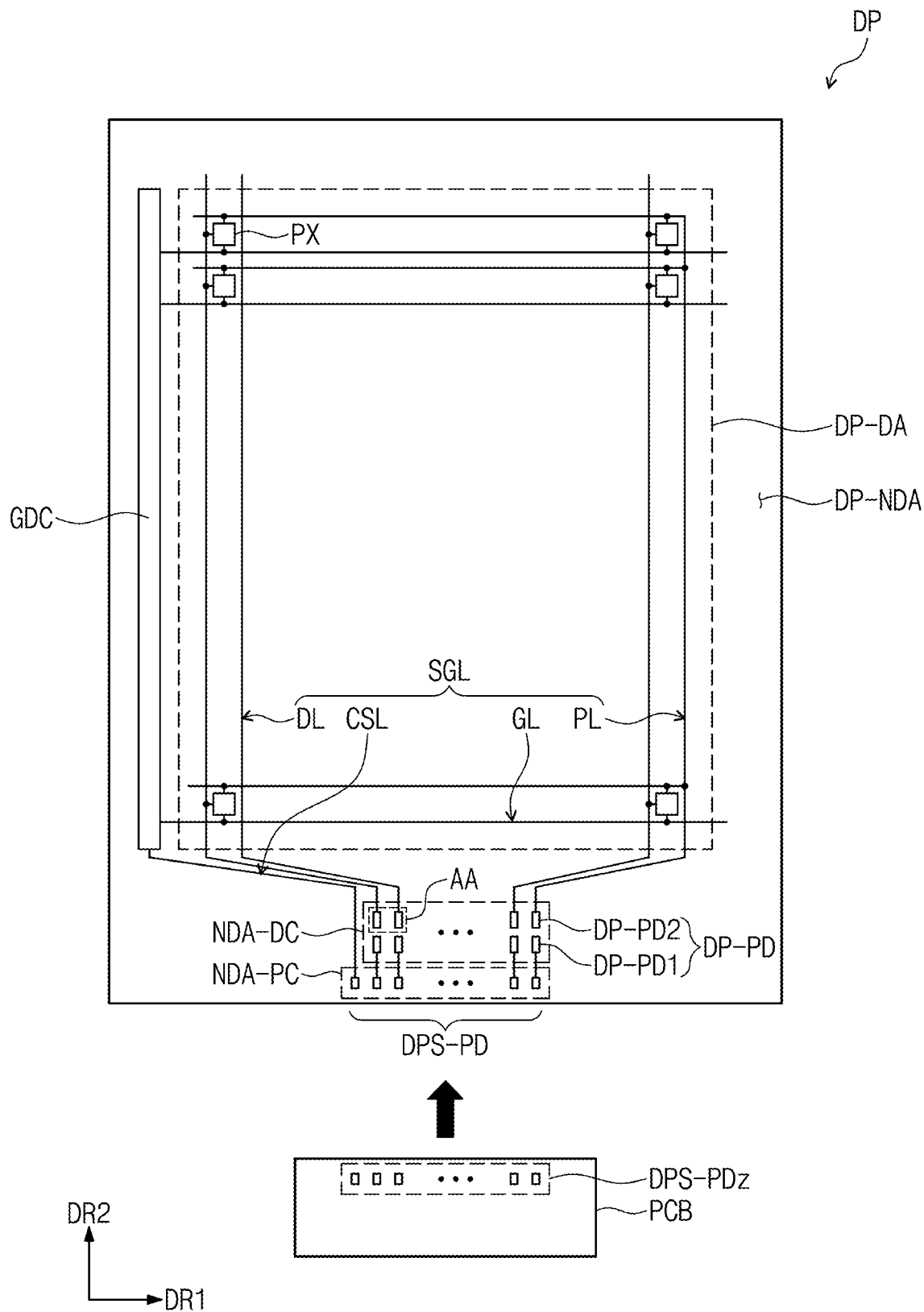
FIG. 3 is a plan view showing an embodiment of a display panel according to the invention.
Figure 4A:
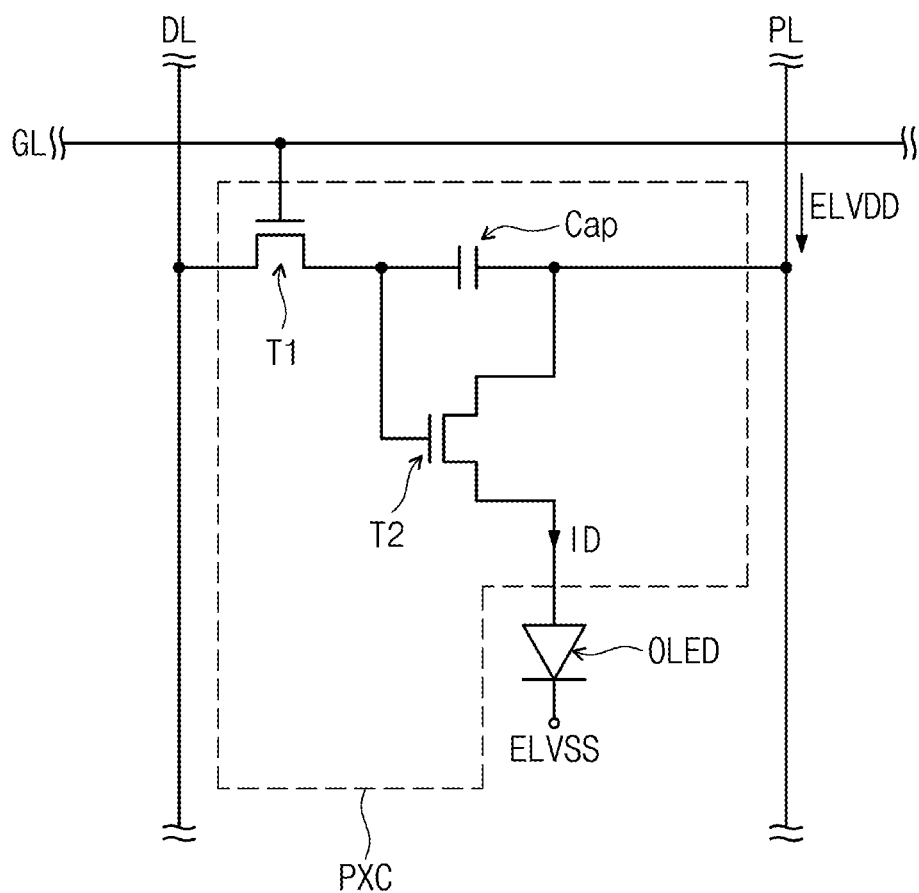
FIG. 4A is an equivalent circuit diagram showing a pixel shown in FIG. 3.
Figure 4B:
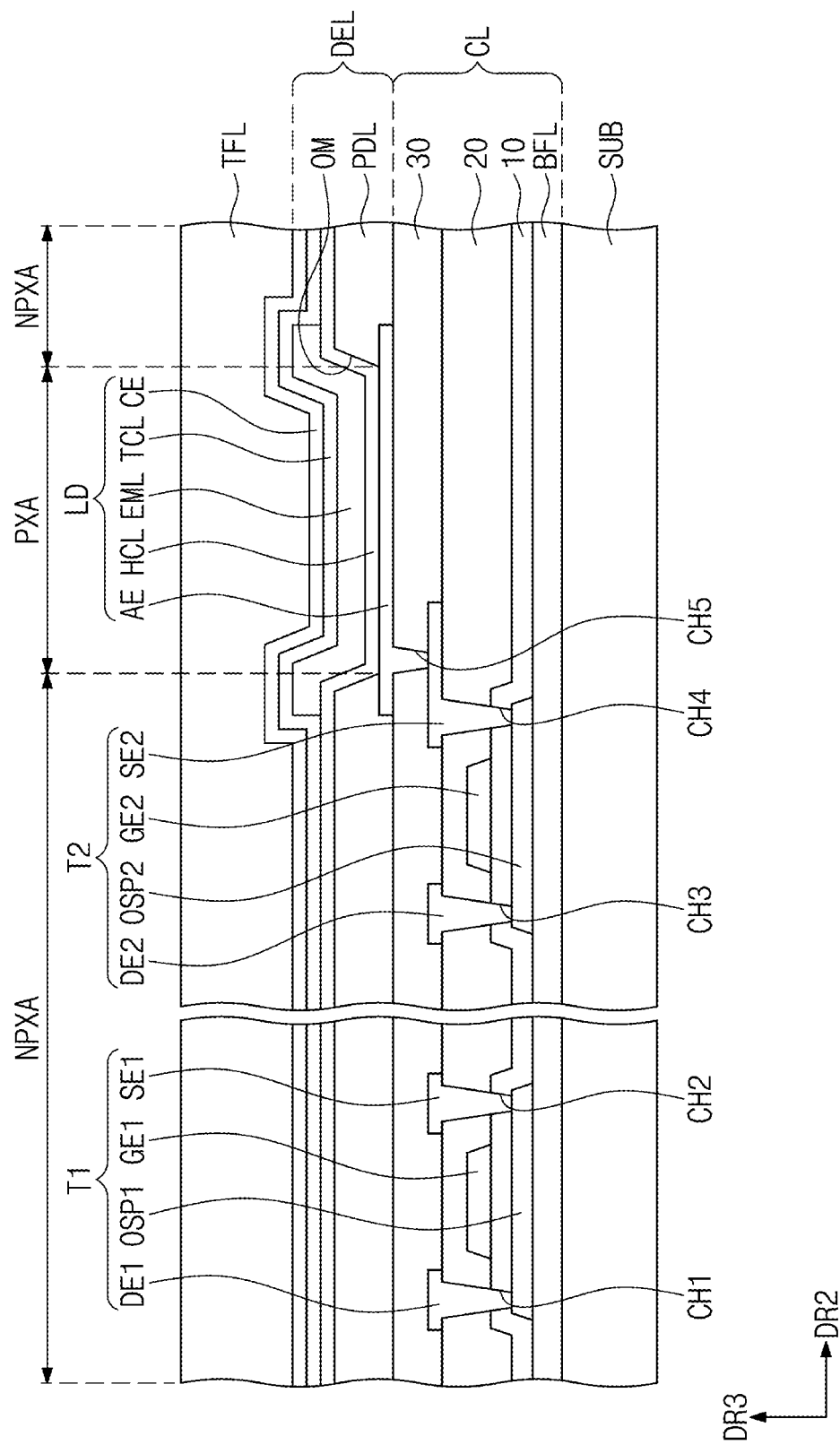
FIG. 4B is an enlarged cross-sectional view showing an embodiment of a display panel according to the invention.

FIG. 3 is a plan view showing an embodiment of a display panel according to the invention. FIG. 4A is an equivalent circuit diagram showing a pixel shown in FIG. 3. FIG. 4B is an enlarged cross-sectional view showing an embodiment of a display panel according to the invention.

Referring to FIG. 3, the display panel DP may include a driving circuit GDC, a plurality of signal lines SGL, a plurality of signal pads DP-PD, a plurality of first connection pads DPS-PD, and a plurality of pixels PX. The pixels PX are arranged in the display area DP-DA. Each of the pixels includes the organic light emitting diode and the pixel driving circuit. The driving circuit GDC, the signal lines SGL, the signal pads DP-PD, the first connection pads DPS-PD, and the pixel driving circuit may be included in the circuit element layer CL shown in FIG. 2.

The driving circuit GDC may include a scan driving circuit. The scan driving circuit generates a plurality of scan signals and sequentially outputs the scan signals to scan lines GL described later. The scan driving circuit further outputs another control signal to the pixel driving circuit of the pixels PX.

In an embodiment, the scan driving circuit may include a plurality of thin film transistors provided through the same processes, e.g., a low temperature polycrystalline silicon ("LTPS") process or a low temperature polycrystalline oxide ("LTPO") process, as the pixel driving circuit of the pixels PX.

The signal lines SGL include the scan lines GL, data lines DL, a power line PL, and a control signal line CSL. Each of the scan lines GL is connected to a corresponding pixel among the pixels PX, and each of the data lines DL is connected to a corresponding pixel among the pixels PX. The power line PL is connected to the pixels PX. The control signal line CSL provides the control signals to the scan driving circuit.

The signal lines SGL overlap the display area DP-DA and the non-display area DP-NDA. Each of the signal lines SGL includes a pad portion and a line portion. The line portion overlaps the display area DP-DA and the non-display area DP-NDA. The pad portion is connected to an end of the line portion. The pad portion is disposed in the non-display area DP-NDA and overlaps a corresponding signal pad among the signal pads DP-PD.

Hereinafter, an area in which the signal pads DP-PD are arranged in the non-display area DP-NDA may be referred to as a "chip area NDA-DC", and an area in which the first connection pads DPS-PD are arranged in the non-display area DP-NDA may be referred to as a "first pad area NDA-PC".

In an embodiment, the electronic component DC shown in FIG. 1B may be disposed (e.g., mounted) on the chip area NDA-DC. The signal pads DP-PD may be electrically connected to the electronic component DC to transmit electrical signals provided from the electronic component DC to the signal lines SGL.

In detail, the signal pads DP-PD include first signal pads DP-PD1 arranged in a first row along the first direction DR1 and second signal pads DP-PD2 arranged in a second row along the first direction DR1, however, they should not be limited thereto or thereby. That is, the signal pads DP-PD may be arranged in one row along the first direction DR1.

A portion of a circuit board PCB may be disposed in the first pad area NDA-PC. The first connection pads DPS-PD are electrically connected to the circuit board PCB and transmit electrical signals from the circuit board PCB to the signal pads DP-PD. The circuit board PCB may be rigid or flexible. In an embodiment, when the circuit board PCB is flexible, a flexible printed circuit board may be provided as the circuit board PCB, for example.

The circuit board PCB may include a timing control circuit that controls an operation of the display panel DP. The timing control circuit may be disposed (e.g., mounted) on the circuit board PCB in the form of an integrated chip. In addition, although not shown in drawing figures, the circuit board PCB may include an input sensing circuit that controls the input sensing unit ISU.

The circuit board PCB may include second connection pads DPS-PDz electrically connected to the display panel DP. The second connection pads DPS-PDz may be disposed in a second pad area defined in the circuit board PCB. The second connection pads DPS-PDz are electrically bonded to the first connection pads DPS-PD. As an example, the first connection pads DPS-PD and the second connection pads DPS-PDz may be electrically connected to each other using the anisotropic conductive film or may directly contact each other using the ultrasonic bonding method.

FIG. 4A shows a pixel PX connected to one scan line GL, one data line DL, and the power line PL as an embodiment. However, the invention should not be limited to the circuit configuration of FIG. 4A, and the circuit configuration of the pixel PX may be changed in various ways.

The pixel PX includes the organic light emitting diode LD and the pixel driving circuit PXC. The organic light emitting diode LD is included in the display element layer DEL shown in FIG. 2. The organic light emitting diode LD may be a front surface light-emitting type diode or a rear surface light-emitting type diode.

The pixel driving circuit PXC is a circuit to drive the organic light emitting diode LD and includes a first transistor T1 (or referred to as "switching transistor"), a second transistor T2 (or referred to as "driving transistor"), and a capacitor Cap. The pixel driving circuit PXC is included in the circuit element layer CL shown in FIG. 2. In the illustrated embodiment, the pixel driving circuit PXC includes two transistors, however, the structure of the pixel driving circuit PXC may be changed in various ways depending on embodiments.

The organic light emitting diode LD generates a light in response to electrical signals applied thereto from the first and second transistors T1 and T2.

The first transistor T1 outputs a data signal applied to the data line DL in response to a scan signal applied to the scan line GL. The capacitor Cap is charged with a voltage corresponding to the data signal provided from the first transistor T1. A first power source voltage ELVDD is applied to a first electrode AE (refer to FIG. 4B) through the second transistor T2, and a second power source voltage ELVSS is applied to a second electrode CE (refer to FIG. 4B). The second power source voltage ELVSS may be lower than the first power source voltage ELVDD.

The second transistor T2 is electrically connected to the organic light emitting diode LD through the first electrode AE. The second transistor T2 controls a driving current ID flowing through the organic light emitting diode LD depending on an amount of electric charges charged in the capacitor Cap. The organic light emitting diode LD emits the light during a turn-on period of the second transistor T2.

FIG. 4B shows a cross-section of a portion of the display panel DP corresponding to the equivalent circuit shown in FIG. 4A. The circuit element layer CL, the display element layer DEL, and the insulating layer TFL are sequentially disposed on the substrate SUB.

The circuit element layer CL includes at least one insulating layer and a circuit element. The circuit element includes the signal lines, the pixel driving circuit, and the pads. The circuit element layer CL may be provided by coating and depositing processes used to form an insulating layer, a semiconductor layer, and a conductive layer and a photolithography process used to pattern the insulating layer, the semiconductor layer, and the conductive layer.

The circuit element layer CL includes a buffer layer BFL, a first intermediate inorganic layer 10, and a second intermediate inorganic layer 20, each of which is an inorganic layer, and includes a third insulating layer 30 that is an organic layer. The buffer layer BFL includes a plurality of inorganic layers stacked one on another. FIG. 4B shows an arrangement relationship between a first semiconductor pattern OSP1, a second semiconductor pattern OSP2, a first control electrode GE1, a second control electrode GE2, a first input electrode DE1, a first output electrode SE1, a second input electrode DE2, and a second output electrode SE2, which form the switching transistor T1 and the driving transistor T2, as an example. First, second, third, and fourth through holes CH1, CH2, CH3, and CH4 are also shown by way of example.

The display element layer DEL includes the organic light emitting diode LD and the pixel definition layer PDL. The organic light emitting diode LD includes the first electrode AE, a hole control layer HCL, a light emitting layer EML, an electron control layer TCL, and the second electrode CE. The pixel definition layer PDL is an organic layer and is provided with an opening OM defined therethrough. At least a portion of the first electrode AE is exposed through the opening OM of the pixel definition layer PDL.

In detail, the first electrode AE is disposed on the third insulating layer 30. The first electrode AE is connected to the second output electrode SE2 through a fifth through hole CH5 defined through the third insulating layer 30.

The display area DP-DA of the display panel DP includes a pixel area PXA and a light blocking area NPXA defined adjacent to the pixel area PXA. The pixel area PXA indicates an area where the image is actually output to the outside. As an example, the light blocking area NPXA surrounds the pixel area PXA.

The hole control layer HCL may be commonly disposed on the pixel area PXA and the light blocking area NPXA. The hole control layer HCL may include a hole transport layer and may further include a hole injection layer. The light emitting layer EML may be disposed on the hole control layer HCL. The light emitting layer EML may be disposed in an area corresponding to a light emitting opening OM. That is, the light emitting layer EML may be provided in each of the pixels after being divided into plural portions. The light emitting layer EML may include an organic material and/or an inorganic material. The light emitting layer EML may generate a predetermined color light.

The electron control layer TCL may be disposed on the light emitting layer EML. The electron control layer TCL may include an electron transport layer and may further include an electron injection layer. The hole control layer HCL and the electron control layer TCL may be commonly provided in plural pixels using an open mask. The second electrode CE may be disposed on the electron control layer TCL. The second electrode CE may have an integral shape and may be commonly disposed in the electron control layer TCL included in each pixel.

According to the invention, the light emitting layer EML may be defined by the opening OM, and the light generated from the light emitting layer EML is transmitted to the pixel area PXA.

The insulating layer TFL may be disposed on the second electrode CE. The insulating layer TFL may be provided by a single encapsulation layer or by a plurality of thin films.

Figure 5A:
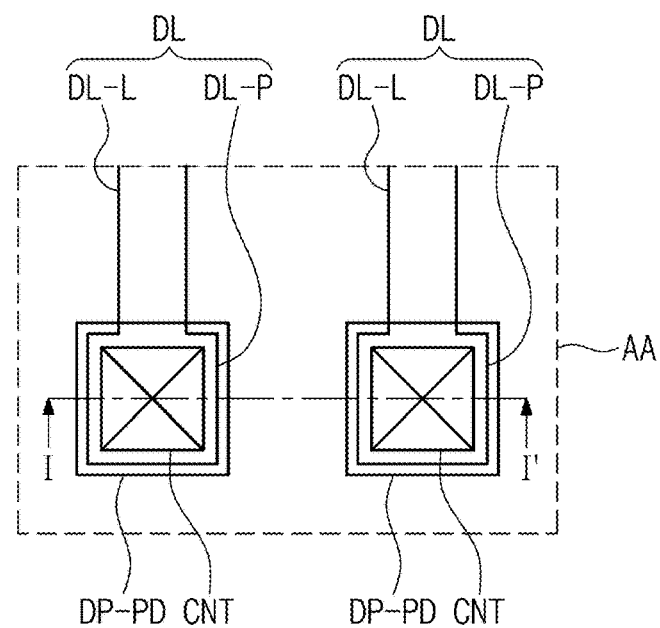
FIG. 5A is an enlarged view showing an area AA shown in FIG. 3.
Figure 5B:
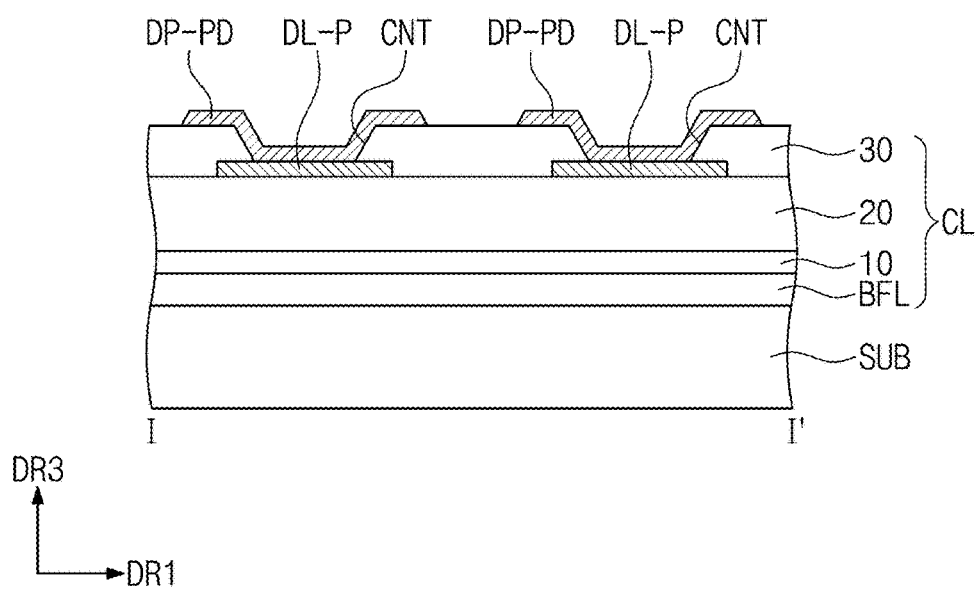
FIG. 5B is a cross-sectional view taken along line I-I' shown in FIG. 5A.

FIG. 5A is an enlarged view showing an area AA shown in FIG. 3. FIG. 5B is a cross-sectional view taken along line I-I' shown in FIG. 5A.

FIG. 5A shows a line portion DL-L and a pad portion DL-P of each of two data lines among the data lines DL shown in FIG. 3. Each of the signal lines SGL described in FIG. 3 includes the line portion DL-L and the pad portion DL-P, however, the line portion DL-L and the pad portion DL-P may be separate components. As shown in FIG. 5A, the pad portion DL-P may have an area greater than that of the line portion DL-L under the same length condition. In addition, the pad portion DL-P has a quadrangular shape, however, the shape of the pad portion DL-P may be changed in the manufacturing process.

Referring to FIG. 5B, the pad portion DL-P of the data line DL may be disposed on the second intermediate inorganic 20 (also referred to as "second insulating layer") of the circuit element layer CL. A contact hole CNT may be defined through the third insulating layer 30 disposed on the second insulating layer 20 to expose the pad portion DL-P. The signal pad DP-PD contacts the pad portion DL-P through the contact hole CNT and is disposed on the third insulating layer 30.

According to the invention, the signal pad DP-PD may be a pad that contacts one component included in the electronic component DC. That is, as described above, the signal pad DP-PD included in the display panel DP and the pad included in the electronic component DC may be bonded to each other by the ultrasonic bonding method. As a result, the driving signal from the electronic component DC may be transmitted to the data line DL via the signal pad DP-PD.

Figure 6:
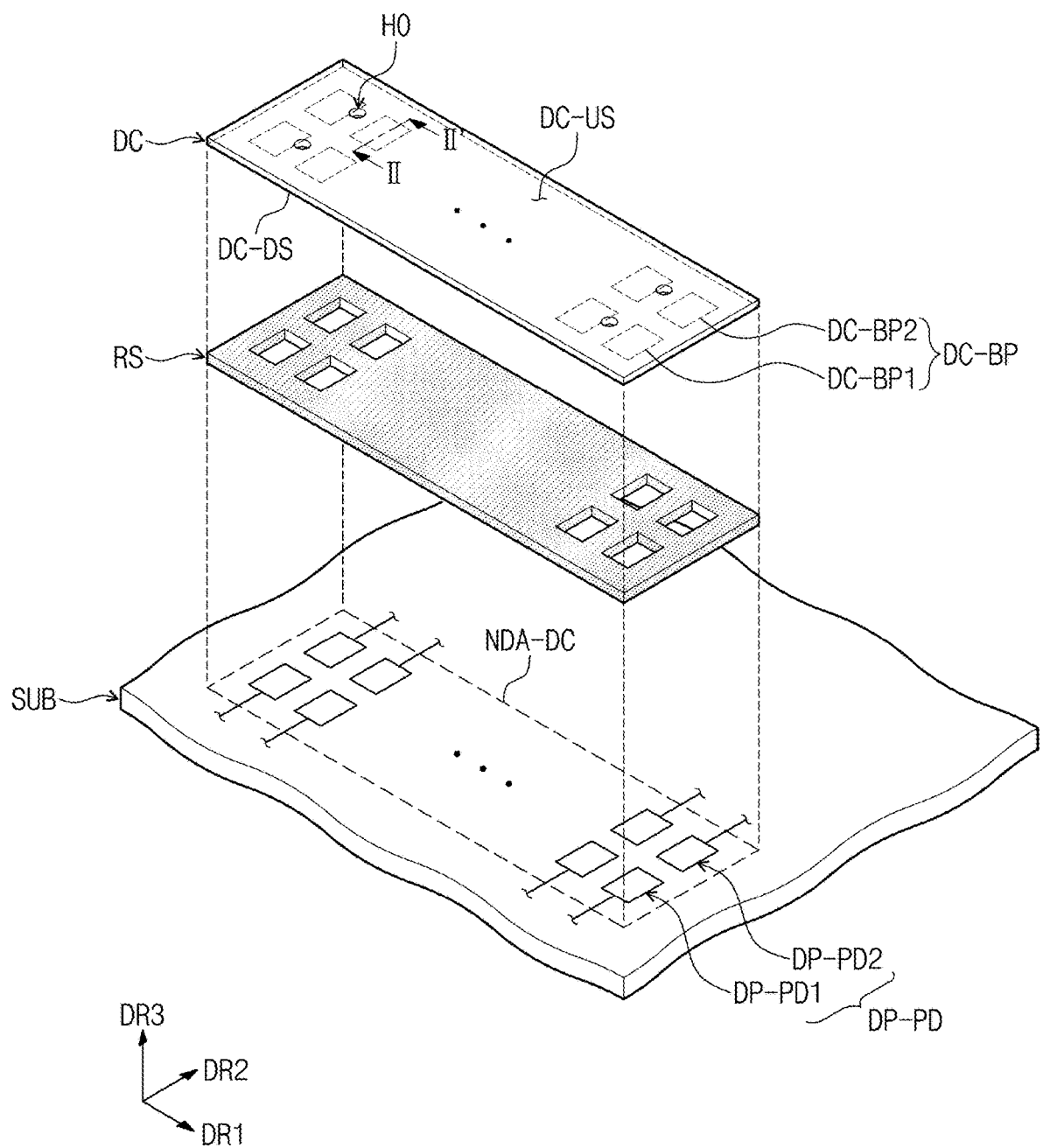
FIG. 6 is an exploded perspective view showing an embodiment of a display device according to the invention.
Figure 7:
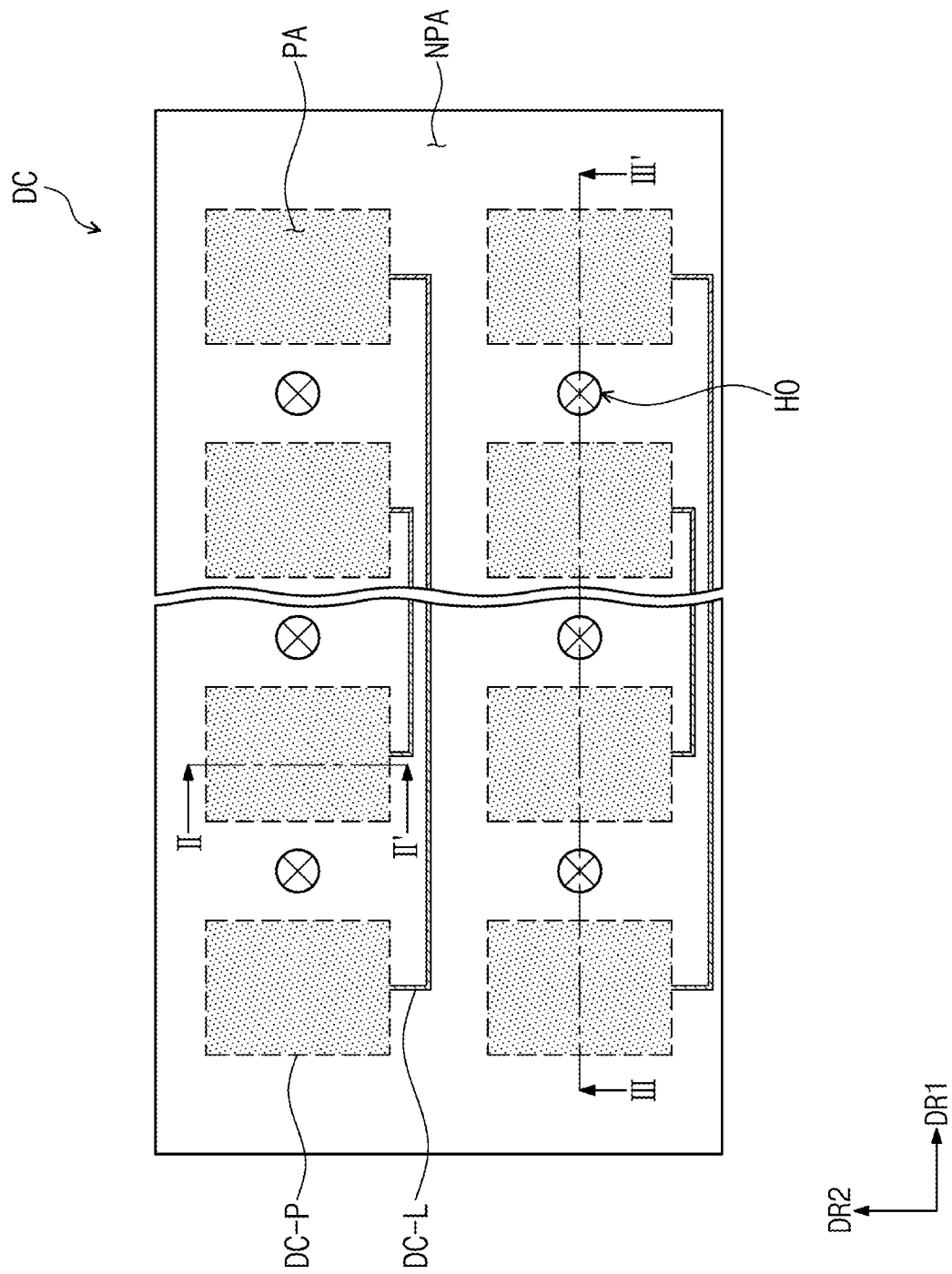
FIG. 7 is a plan view showing an embodiment of an electronic component according to the invention.
Figure 8A:
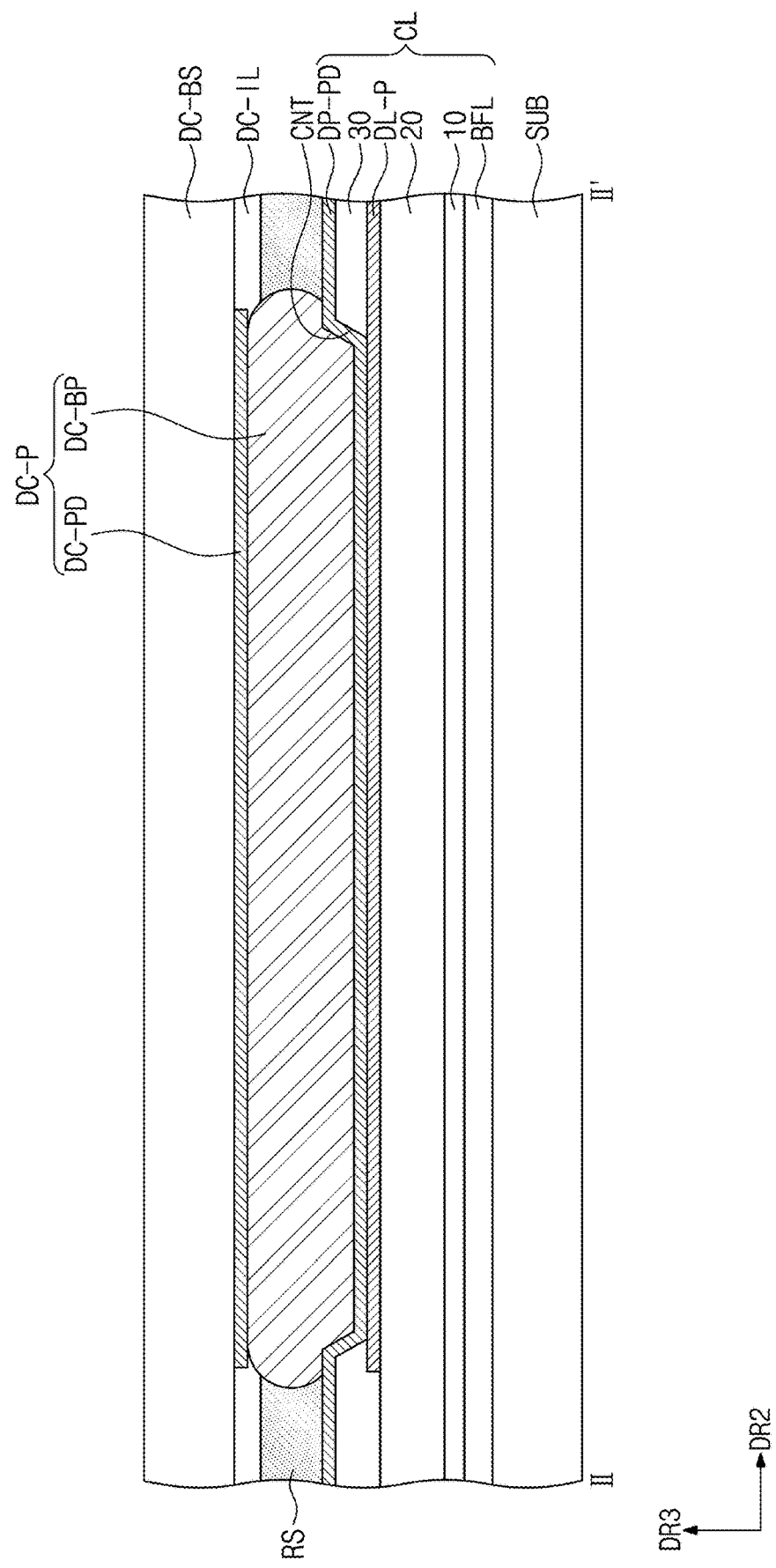
FIG. 8A is a cross-sectional view taken along line II-II' shown in FIG. 7.
Figure 8B:
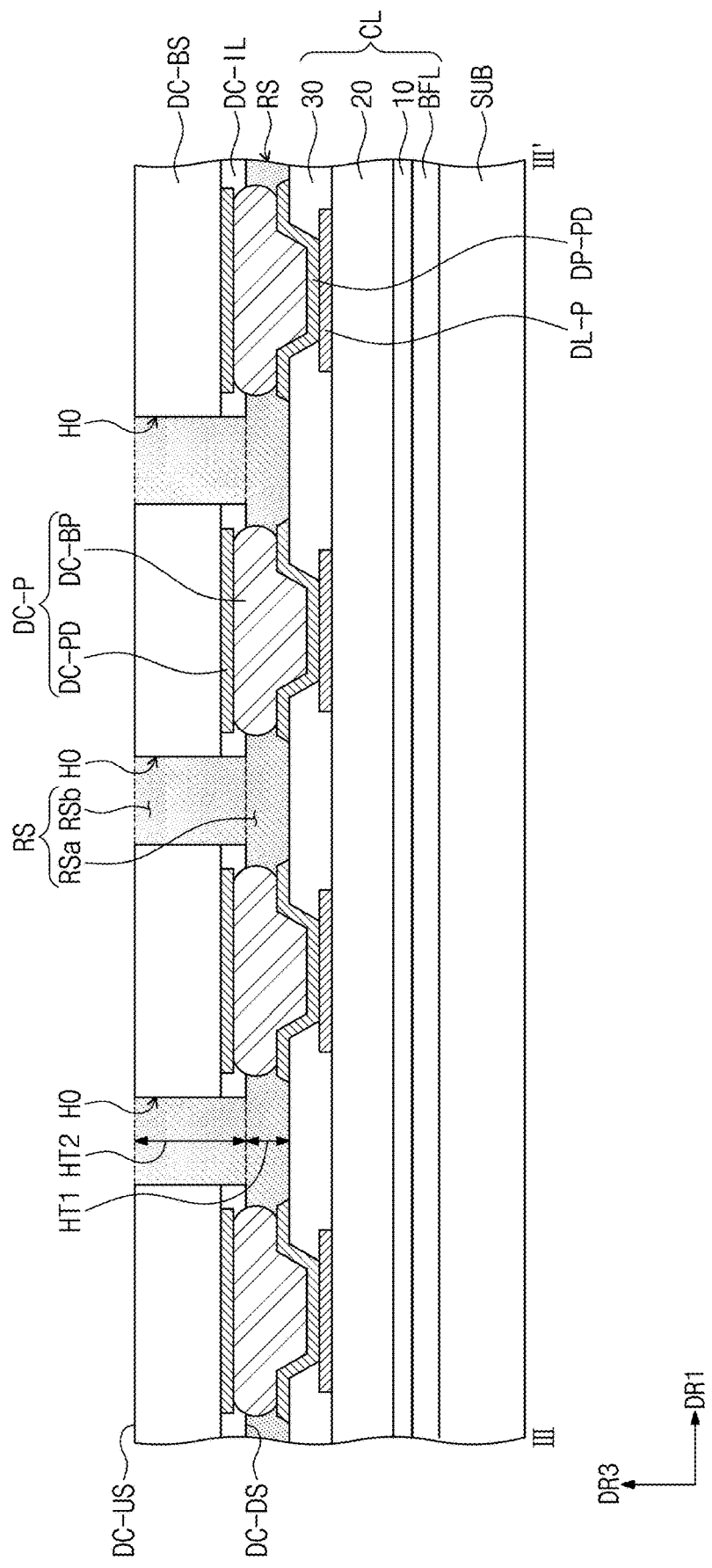
FIG. 8B is a cross-sectional view taken along line III-III' shown in FIG. 7.

FIG. 6 is an exploded perspective view showing an embodiment of a display device according to the invention. FIG. 7 is a plan view showing an embodiment of an electronic component according to the invention. FIG. 8A is a cross-sectional view taken along line shown in FIG. 7. FIG. 8B is a cross-sectional view taken along line shown in FIG. 7.

Referring to FIG. 6, the electronic component DC includes an upper surface DC-US and a lower surface DC-DS. In the illustrated embodiment, the lower surface DC-DS of the electronic component DC may be a surface facing the display panel DP.

The electronic component DC includes driving bumps DC-BP respectively and directly making contact with the signal pads DP-PD disposed on the substrate SUB described with reference to FIG. 3. The driving bumps DC-BP include first driving bumps DC-BP1 arranged in the first row along the first direction DR1 and second driving bumps DC-BP2 arranged in the second row along the first direction DR1. The first driving bumps DC-BP1 and the second driving bumps DC-BP2 may be exposed to the outside in the lower surface of the electronic component DC.

In the embodiment of the invention, the first driving bumps DC-BP1 electrically contact the first signal pads DP-PD1 by the ultrasonic bonding method. The second driving bumps DC-BP2 electrically contact the second signal pads DP-PD2 by the ultrasonic bonding method. Although not shown in drawing figures, the electronic component DC may include a circuit element that applies electrical signals to the first driving bumps DC-BP1 and the second driving bumps DC-BP2.

In the embodiment of the invention, a filler RS may be filled between the electronic component DC and the display panel DP after the electronic component DC is disposed (e.g., mounted) on the display panel DP by the ultrasonic bonding method. The filler RS may be disposed between the electronic component DC and the display panel DP to shield the driving bumps DC-BP and the signal pads DP-PD from external air. As a result, the driving bump DC-BP and the signal pad DP-PD may be prevented from oxidizing. As an example, the filler RS may include a resin.

The filler RS may surround an outer surface of the driving bump DC-BP and the signal pad DP-PD, which are bonded to each other by the ultrasonic bonding method, and may be disposed between the electronic component DC and the display panel DP. In a plan view, the filler RS may surround the driving bump DC-BP.

An operation of irradiating an external ultraviolet light to the filler RS is desired to cure the filler RS after disposing the filler RS between the electronic component DC and the display panel DP. The external ultraviolet light may be irradiated to the filler RS through the upper surface DC-US of the electronic component DC. As a thickness of the electronic component DC increases, an intensity of the external ultraviolet light transmitting to the filler RS may be weakened.

In the embodiment of the invention, at least one hole HO, which does not overlap the driving bump DC-BP in a plan view, may be defined through the upper surface DC-US of the electronic component DC. As the external ultraviolet light is transmitted to the filler RS through the hole HO defined through the upper surface DC-US of the electronic component DC, a curing efficiency of the filler RS may increase. In particular, when the hole HO defined through the upper surface DC-US of the electronic component DC is provided in plural, the curing efficiency of the filler RS may be improved.

FIG. 7 shows the hole HO defined through the upper surface DC-US of the electronic component DC. In particular, the hole HO in an embodiment may have an opening shape defined through the upper surface DC-US and the lower surface DC-DS of the electronic component DC. Accordingly, the filler RS may be exposed to the outside through the hole HO.

In addition, the electronic component DC may include a driving pad portion DC-P including the above-described driving bump DC-BP, a driving line portion DC-L, and a circuit element (not shown). In this case, the driving pad portion DC-P may overlap a pad area PA of the electronic component DC. The hole HO may overlap a non-pad area NPA of the electronic component DC. The driving line portion DC-L may electrically connect the driving pad portion DC-P to the circuit element. Each of the driving pad portion DC-P, the driving line portion DC-L, and the circuit element may include a metal material having electrical characteristics. As a result, when the external ultraviolet light is transmitted to the driving pad portion DC-P, the driving line portion DC-L, and the circuit element, the external ultraviolet light may be reflected.

In the embodiment of the invention, the hole HO may not overlap the driving pad portion DC-P, the driving line portion DC-L, and the circuit element in a plan view. Particularly, as the filler RS is exposed to the outside through the hole HO, the external ultraviolet light incident through the hole HO may be directly transmitted to the filler RS. As a result, the curing characteristics of the filler RS may be improved.

In detail, referring to FIG. 8A, the electronic component DC further includes a base layer DC-BS, the driving pad portion DC-P (refer to FIG. 7), and a pad insulating layer DC-IL. The driving pad portion DC-P includes a driving pad DC-PD and the driving bump DC-BP.

An upper surface of the base layer DC-BS may correspond to the upper surface DC-US of the electronic component DC. A lower surface of the pad insulating layer DC-IL facing the display panel DP may correspond to the lower surface DC-DS of the electronic component DC. As an example, the base layer DC-BS may include a silicon material. The base layer DC-BS may have a predetermined thickness in the third direction DR3.

The driving pad DC-PD may be disposed on the lower surface of the base layer DC-BS. The driving pad DC-PD may be electrically connected to the circuit element (not shown) of the electronic component DC. The pad insulating layer DC-IL is disposed on the lower surface of the base layer DC-BS to expose a portion of the driving pad DC-PD. In this case, a through hole through which the portion of the driving pad DC-PD is exposed may be defined through the pad insulating layer DC-IL. The driving bump DC-BP may be directly disposed on the driving pad DC-PD.

In the embodiment of the invention, the driving bump DC-BP may be bonded to the signal pad DP-PD by the ultrasonic bonding method. In detail, when an ultrasonic vibration is applied to an interface between the driving bump DC-BP and the signal pad DP-PD, a frictional heat is generated at the interface. In addition, since a pressure is applied to the driving bump DC-BP and the signal pad DP-PD from the upper surface of the base layer DC-BS, the driving bump DC-BP and the signal pad DP-PD may be bonded (or welded) at the interface due to the frictional heat.

The filler RS may be disposed between the pad insulating layer DC-IL and the third insulating layer 30. The filler RS may surround the driving bump DC-BP in a plan view.

Referring to FIG. 8B, the hole HO described with reference to FIG. 7 may be defined through the upper surface DC-US of the electronic component DC and the upper surface of the base layer DC-BS. That is, the hole HO may penetrate the base layer DC-BS and the pad insulating layer DC-IL and may have a thickness corresponding to a thickness of the electronic component DC. In addition, the hole HO may be provided in plural, and the holes HO may be spaced apart from each other in a plan view. The holes HO may not overlap the driving bump DC-BP and may expose the filler RS to the outside.

In the embodiment of the invention, the filler RS includes a first filling portion RSa and a second filling portion RSb. The first filling portion RSa may be disposed between the pad insulating layer DC-IL of the electronic component DC and the third insulating layer 30 of the display panel DP. A height of the first filling portion RSa in the third direction DR3 will be referred to as a "first length HT1". The second filling portion RSb may be disposed in the hole HO. A height of the second filling portion RSb corresponds to a height of the hole HO in the third direction DR3 and will be referred to as a "second length HT2", which is longer than the first length HT1.

In particular, an upper surface of the second filling portion RSb, which is exposed to the outside, may provide a flat surface together with the upper surface of the base layer DC-BS. That is, the second filling portion RSb may fill a space of the hole HO entirely.

In addition, according to FIG. 8B, the external ultraviolet light may be transmitted to the first filling portion RSa through the second filling portion RSb. Although the base layer DC-BS absorbs the ultraviolet light, the filler RS easily transmits the ultraviolet light, and thus, the external ultraviolet light may be more efficiently transmitted to the first filling portion RSa.

FIGS. 9A to 9E are views showing an embodiment of a manufacturing method of a display device according to the invention.

Figure 9A:
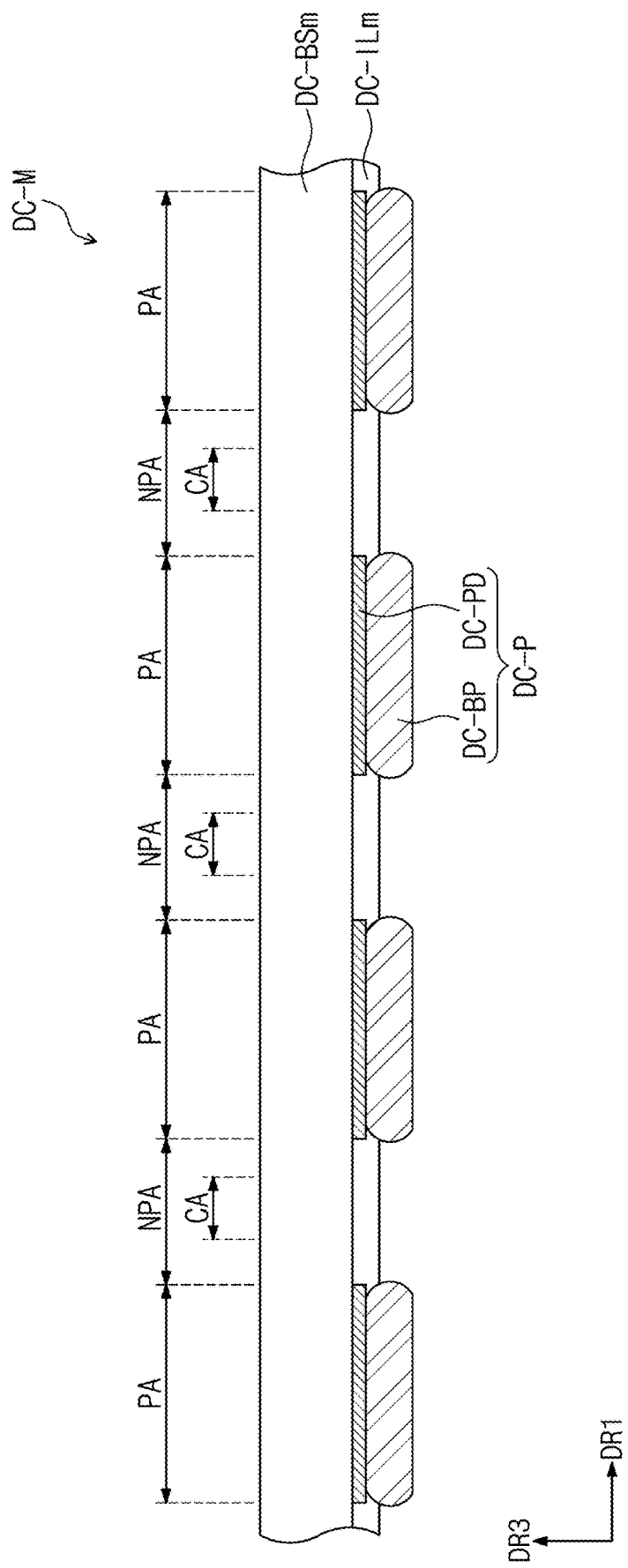
FIGS. 9A to 9E are views showing an embodiment of a manufacturing method of a display device according to the invention.

Referring to FIG. 9A, an electronic component DC-M in which the hole HO is not defined is provided. In this case, a base layer DC-BSm and a pad insulating layer DC-ILm of the electronic component DC-M may be provided as a layer in which the hole HO is not defined.

In addition, the pad area PA that overlaps the driving bump DC-BP and the non-pad area NPA that does not overlap the driving bump DC-BP are defined in the base layer DC-BSm. A cutting area CA through which the hole HO is defined may overlap the non-pad area NPA.

Figure 9B:
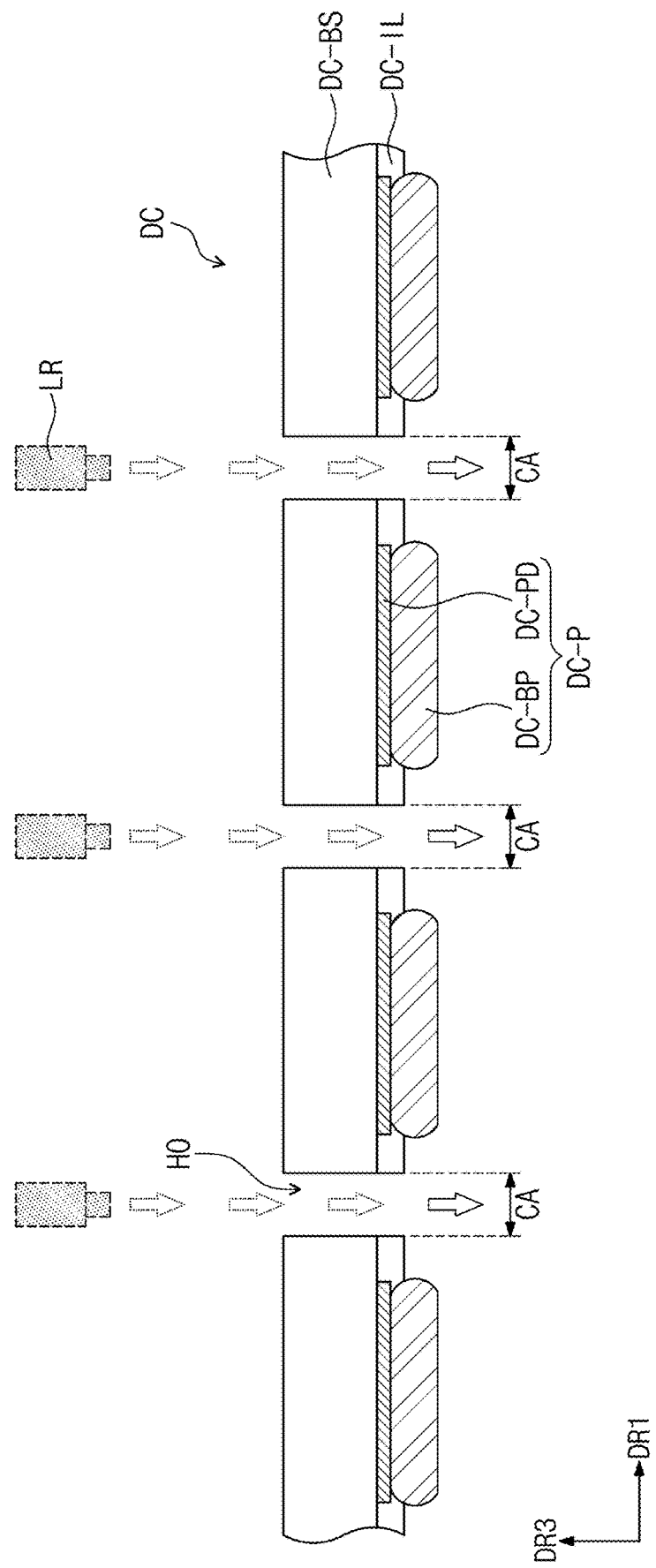

FIG. 9B shows the defining of the hole in the electronic component DC using a laser module LR. Portions of the base layer DC-BS and the pad insulating layer DC-IL, which overlap the cutting area CA, may be removed by a laser beam irradiated from the laser module LR. Thus, the hole HO may be defined through the electronic component DC.

The method of defining the hole HO using the laser module LR has been described as an embodiment, however, the invention should not be limited thereto or thereby. The hole HO overlapping the cutting area CA may be provided in various ways, for example.

Figure 9C:
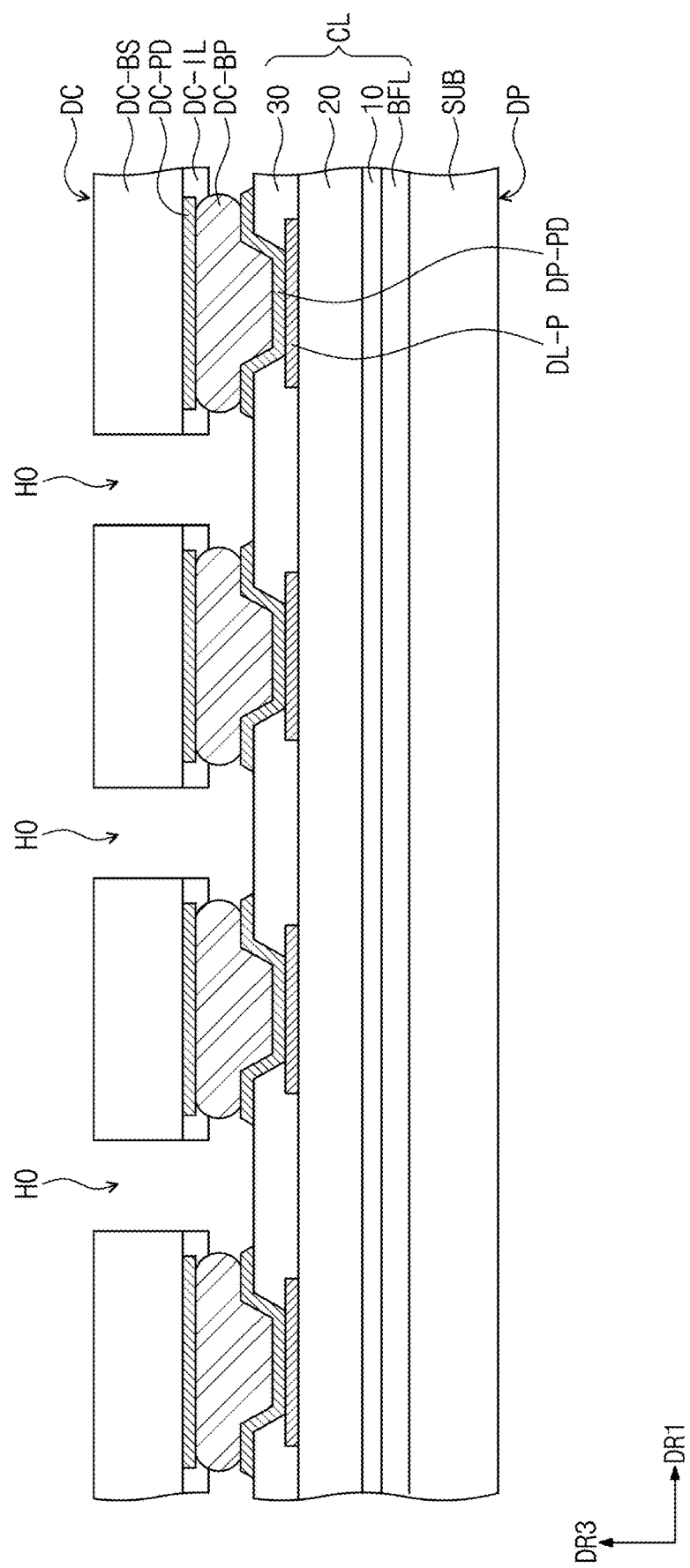

Referring to FIG. 9C, the display panel DP that includes the signal pad DP-PD overlapping the non-display area DP-NDA is provided. Then, a process of aligning the display panel DP and the electronic component DC is performed such that the signal pad DP-PD of the display panel DP faces the driving bump DC-BP of the electronic component DC.

After that, the ultrasonic bonding process described in FIG. 8A is performed between the signal pad DP-PD and the driving bump DC-BP. The signal pad DP-PD and the driving bump DC-BP may electrically contact each other by the ultrasonic bonding process.

In this case, an inner space may be defined between the electronic component DC and the third insulating layer 30 of the display panel DP. The inner space may be divided into a first inner space between the pad insulating layer DC-IL and the third insulating layer 30 and a second inner space corresponding to the hole HO.

Figure 9D:
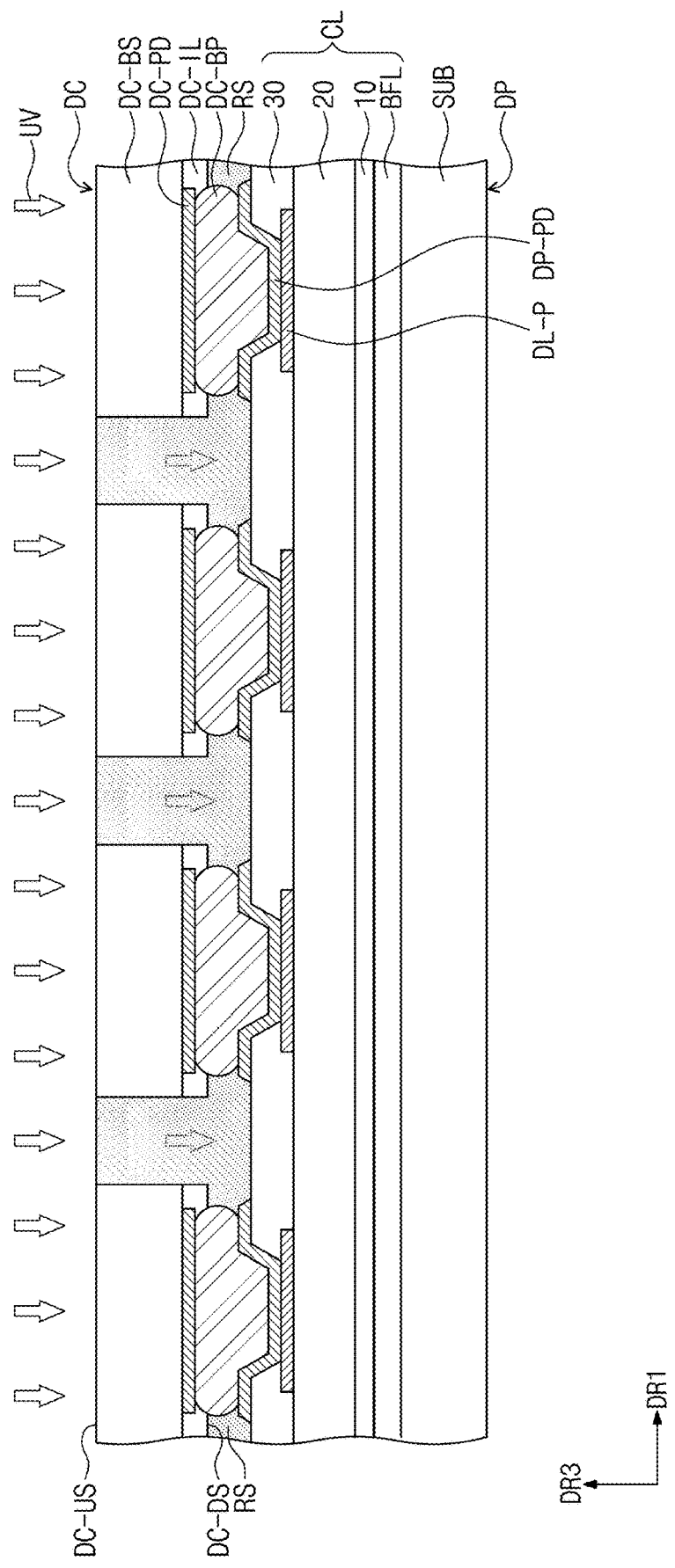

Referring to FIG. 9D, when the signal pad DP-PD and the driving bump DC-BP are bonded to each other by the ultrasonic bonding process, the filler RS may be filled between the electronic component DC and the third insulating layer 30 of the display panel DP. In this case, the filler RS may be filled in the first inner space and the second inner space entirely. According to the invention, the filler RS filled in the second inner space may be filled up to the upper surface DC-US of the electronic component DC.

Then, an ultraviolet light UV may be irradiated to the upper surface DC-US of the electronic component DC. According to the invention, as the ultraviolet light UV is transmitted to the filler RS filled in the first inner space and the second inner space through the hole HO, the curing efficiency of the filler RS may be improved. This is because the ultraviolet light UV transmitted to the second inner space has a relatively strong intensity compared with that of the ultraviolet light UV transmitted to the filler RS through the base layer DC-BS due to the base layer DC-BS that absorbs a portion of the ultraviolet light UV.

Figure 9E:
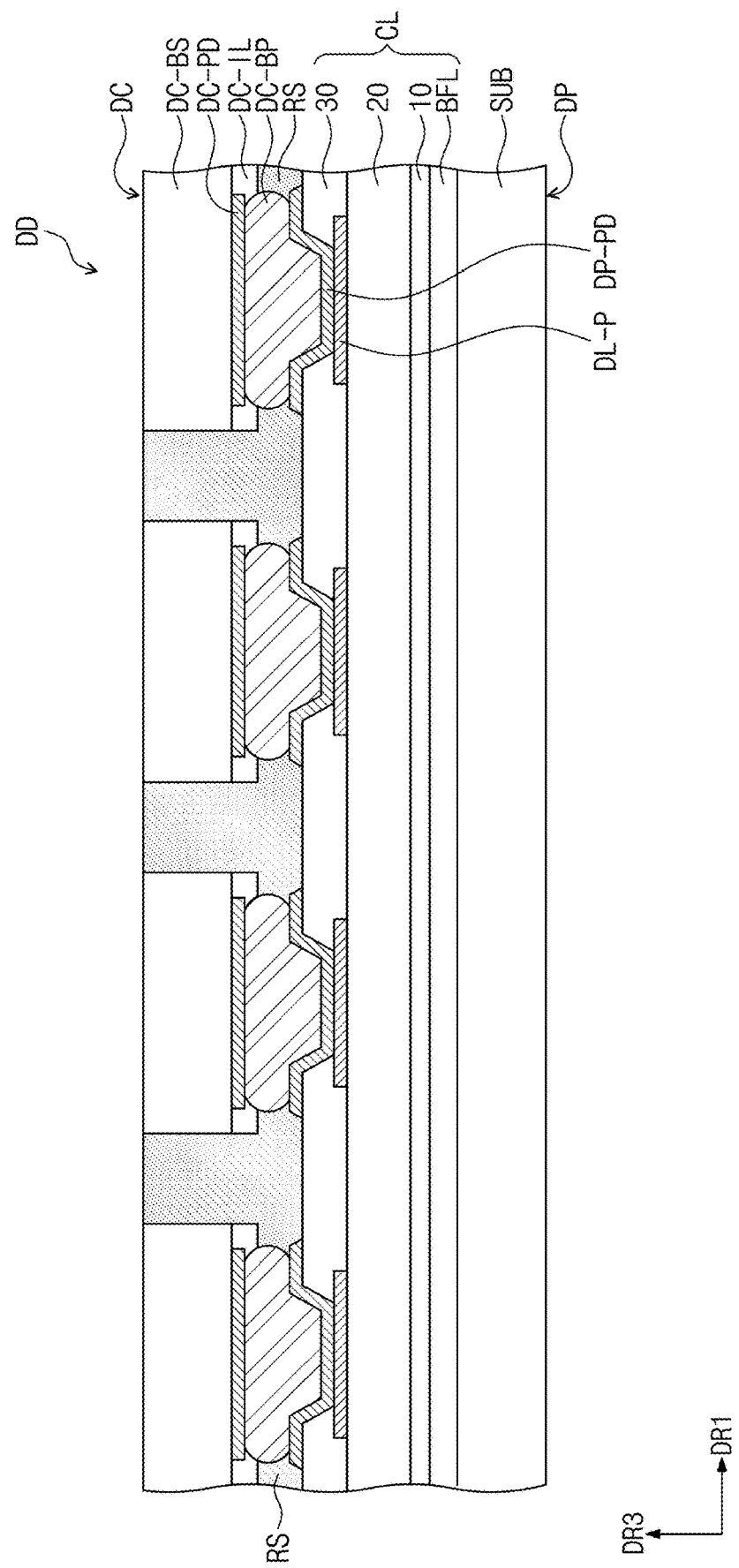

Referring to FIG. 9E, when the curing of the filler RS is completed, the display device DD including the electronic component DC disposed (e.g., mounted) on the display panel DP may be provided.

Figure 10:
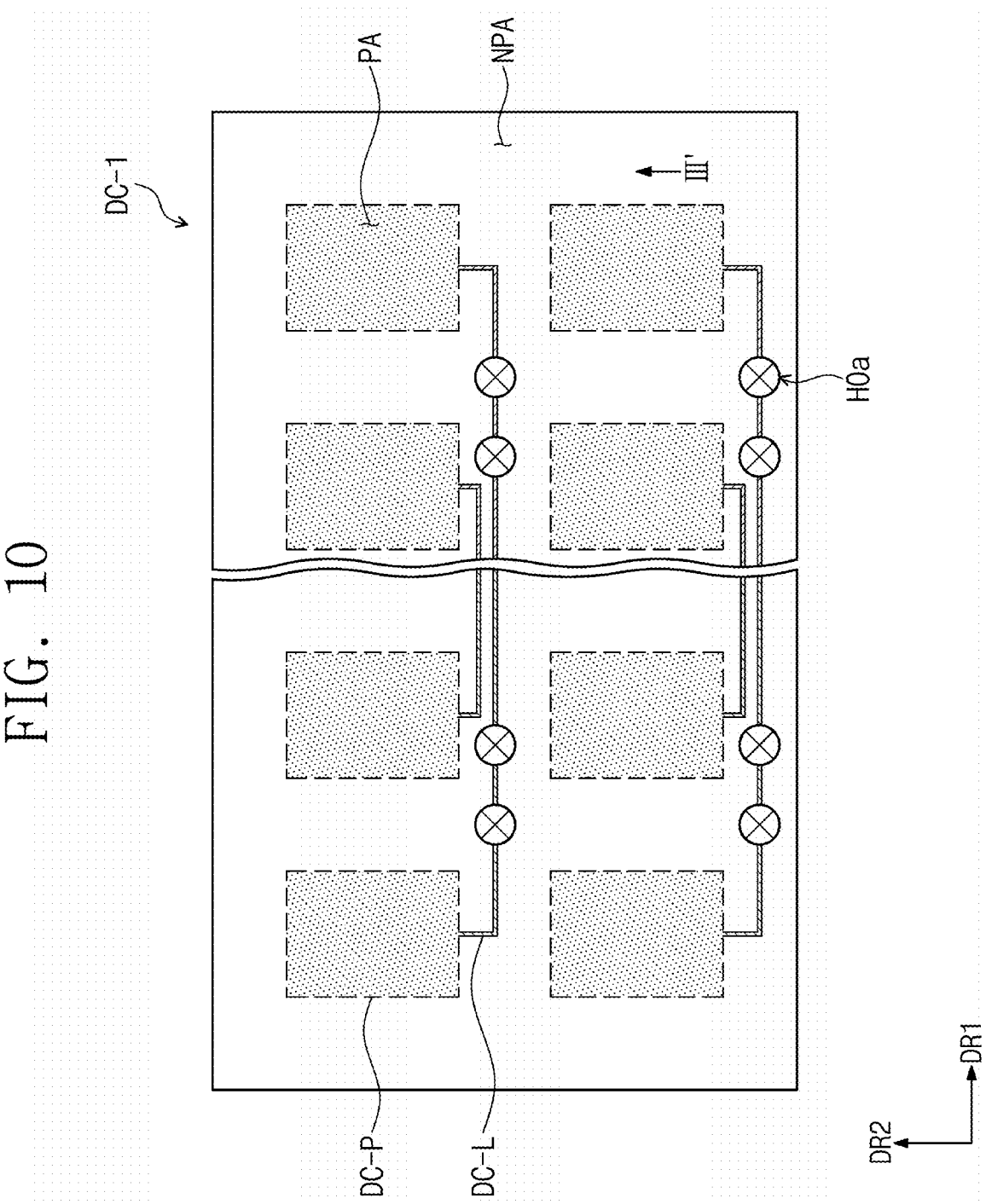
FIG. 10 is a plan view showing another embodiment of an electronic component according to the invention.
Figure 11A:
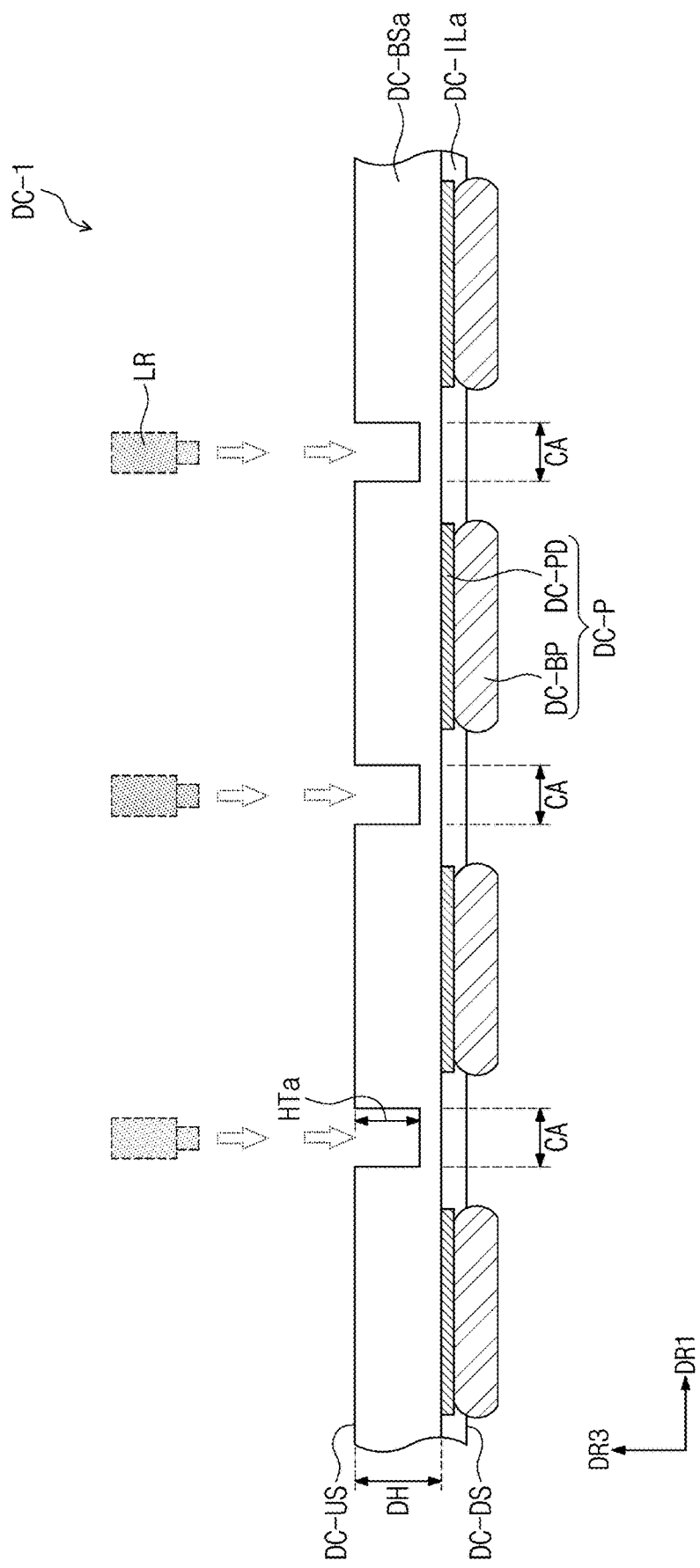
FIGS. 11A to 11C are views showing another embodiment of a manufacturing method of a display device according to the invention.
Figure 11B:
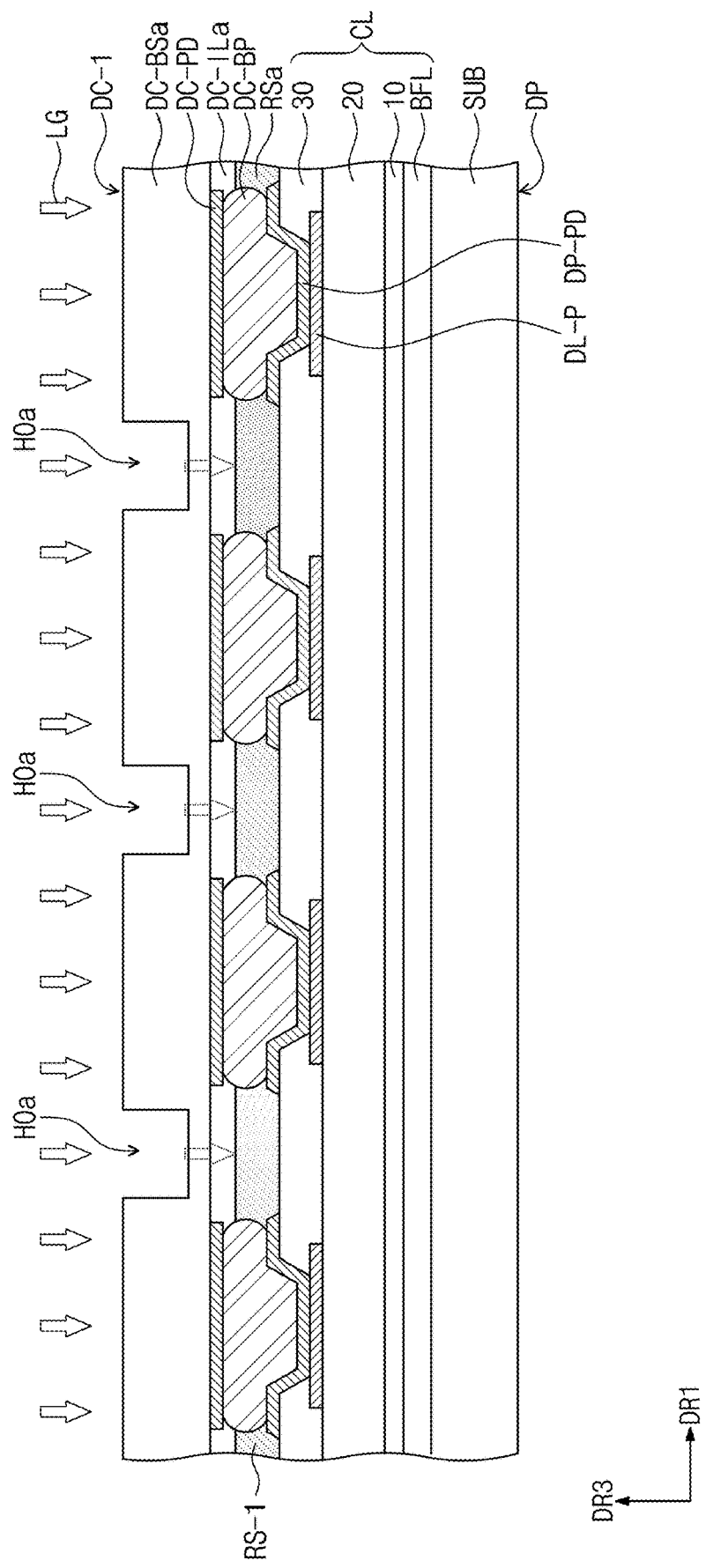
Figure 11C:
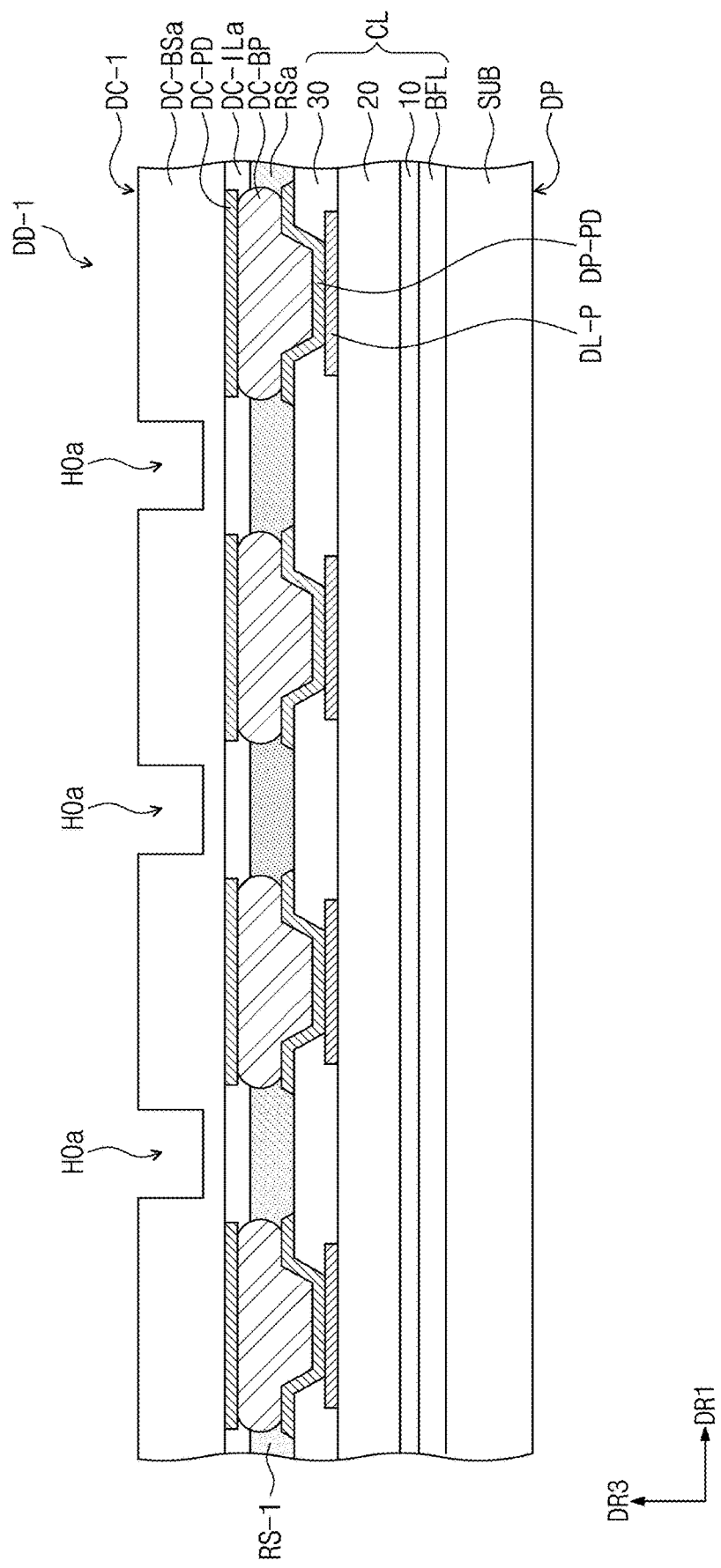

FIG. 10 is a plan view showing another embodiment of an electronic component according to the invention. FIGS. 11A to 11C are views showing another embodiment of a manufacturing method of a display device according to the invention.

Referring to FIG. 10, different from the shape of the hole HO in the embodiment shown in FIG. 7, a hole HOa defined through an upper surface DC-US of an electronic component DC-1 may overlap at least a portion of a driving pad portion DC-P or a driving line portion DC-L. As an example, FIG. 10 shows a structure in which the hole HOa overlaps the driving line portion DC-L.

Hereinafter, an embodiment of the electronic component DC-1 according to the invention will be described with reference to FIGS. 11A to 11C.

Referring to FIG. 11A, a laser beam may be irradiated to a cutting area CA defined in the upper surface DC-US of the electronic component DC-1 using a laser module LR. According to the illustrated embodiment, the hole HOa defined using the laser module LR may have a shape recessed from the upper surface DC-US of the electronic component DC-1.

In detail, the hole HOa defined by the laser beam irradiated on an upper surface of a base layer DC-BSa may have the shape recessed from the upper surface of the base layer DC-BSa by a predetermined height HTa in the third direction DR3 instead of the opening shape. According to the invention, the height HTa of the hole HOa may have a length equal to or greater than about 50 percent (%) and smaller than about 100% of a thickness DH of the base layer DC-BSa. As a result, a pad insulating layer DC-ILa may not be exposed to the outside by the base layer DC-BSa. That is, a separate hole is not defined in the pad insulating layer DC-ILa.

In another embodiment of the invention, the driving line portion DC-L described in FIG. 10 may be disposed on a lower surface of the pad insulating layer DC-ILa. Accordingly, although the hole HOa is defined to overlap the driving line portion DC-L, the driving line portion DC-L may not be damaged. Therefore, the hole HOa shown in FIG. 10 may overlap the driving line portion DC-L. In this case, an area of the hole HOa overlapping the driving line portion DC-L may be smaller than an area of the hole HOa.

Referring to FIG. 11B, when a signal pad DP-PD and a driving bump DC-BP are bonded to each other by the ultrasonic bonding process, a filler RS-1 may be filled between the pad insulating layer DC-ILa of the electronic component DC and the third insulating layer 30 of the display panel DP. In this case, as the filler RS-1 is not filled in the hole HOa, the hole HOa may be provided as an empty space.

Then, an ultraviolet light UV may be irradiated to the upper surface DC-US of the electronic component DC for the curing of the filler RS-1. According to the invention, the ultraviolet light UV is transmitted to the filler RS-1 through the hole HOa defined by removing a portion of the base layer DC-BSa, and thus, the curing efficiency of the filler RS-1 may be improved.

Referring to FIG. 11C, the curing of the filler RS-1 is completed, and the display device DD-1 including the electronic component DC-1 disposed (e.g., mounted) on the display panel DP may be provided. In addition, in another embodiment of the invention shown in FIG. 11C, the hole HOa defined in the electronic component DC-1 may be finally provided as an empty space.

Although the embodiments of the invention have been described, it is understood that the invention should not be limited to these embodiments but various changes and modifications may be made by one ordinary skilled in the art within the spirit and scope of the invention as hereinafter claimed.

Therefore, the disclosed subject matter should not be limited to any single embodiment described herein, and the scope of the invention shall be determined according to the attached claims.

What is claimed is:

1. A display device comprising:
   a display panel comprising a display area and a non-display area defined therein and comprising a plurality of signal pads overlapping the non-display area;
   an electronic component comprising a base layer with an upper surface and a lower surface, a plurality of driving pads disposed on the lower surface of the base layer, and a plurality of driving bumps respectively disposed on the plurality of driving pads, the plurality of driving bumps being respectively connected to the plurality of signal pads; and
   a filler disposed between the display panel and the electronic component, wherein a first hole is defined in the upper surface of the base layer, and the first hole does not overlap the plurality of driving bumps in a plan view.

2. The display device of claim 1, wherein the first hole penetrates the upper surface and the lower surface, and the filler is exposed to an outside by the first hole.

3. The display device of claim 2, wherein the filler comprises a first filling portion disposed between the display panel and the electronic component and a second filling portion disposed in the first hole.

4. The display device of claim 3, wherein an upper surface of the second filling portion provides a flat surface together with an upper surface of the electronic component.

5. The display device of claim 3, wherein the first filling portion has a height smaller than a height of the second filling portion in a thickness direction of the base layer.

6. The display device of claim 1, wherein the first hole has a shape recessed from the upper surface of the base layer.

7. The display device of claim 6, wherein the first hole has a height equal to or greater than about 50 percent and smaller than about 100 percent of a thickness of the base layer in a thickness direction of the base layer.

8. The display device of claim 6, wherein the electronic component further comprises a pad insulating layer disposed on the base layer to expose a portion of each of the plurality of driving pads and driving lines respectively connected to the plurality of driving pads, and the filler is disposed between the pad insulating layer and the display panel.

9. The display device of claim 8, wherein a second hole is further defined in the upper surface of the base layer, the second hole is spaced apart from the first hole in the plan view and recessed from the upper surface of the base layer, and the second hole overlaps at least one driving line among the driving lines.

10. The display device of claim 1, wherein the first hole is provided in plural, and the first holes are defined in the base layer to be spaced apart from each other in the plan view.

11. The display device of claim 1, wherein the display panel further comprises:
    a substrate;
    a circuit element layer disposed on the substrate;
    a plurality of first pads overlapping the non-display area, disposed on the substrate, and electrically connected to the circuit element layer;
    an insulating layer disposed on the substrate to expose a portion of each of the plurality of first pads; and
    a plurality of second pads respectively disposed on the plurality of first pads exposed by the insulating layer, and the plurality of second pads is the plurality of signal pads.

12. The display device of claim 1, wherein the electronic component further comprises a plurality of driving lines respectively and electrically connected to the plurality of driving pads, and the first hole does not overlap the plurality of driving lines in the plan view.

13. The display device of claim 1, wherein the filler surrounds the plurality of driving bumps in the plan view.

* * * * *